United States Patent
Matsushita et al.

(10) Patent No.: US 7,405,088 B2
(45) Date of Patent: Jul. 29, 2008

(54) METHOD FOR ANALYZING FAIL BIT MAPS OF WATERS AND APPARATUS THEREFOR

(75) Inventors: Hiroshi Matsushita, Kanagawa (JP); Kenichi Kadota, Kanagawa (JP); Kenji Kawabata, Kanagawa (JP); Yoshiyuki Shioyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 912 days.

(21) Appl. No.: 10/801,992

(22) Filed: Mar. 17, 2004

(65) Prior Publication Data
US 2004/0255198 A1 Dec. 16, 2004

(30) Foreign Application Priority Data
Mar. 19, 2003 (JP) ............................ P2003-076411

(51) Int. Cl.
*H01L 21/00* (2006.01)
(52) U.S. Cl. .................................. 438/4; 257/E21.525
(58) Field of Classification Search ............. 438/11–18, 438/100, 105–107, 597, 612–613, 660–667; 257/48, 737
See application file for complete search history.

(56) References Cited

U.S. PATENT DOCUMENTS

| | | | |
|---|---|---|---|
| 5,787,190 A * | 7/1998 | Peng et al. ................... | 382/145 |
| 6,545,752 B1 * | 4/2003 | Swan et al. .............. | 356/237.4 |
| 2003/0054573 A1 * | 3/2003 | Tanaka et al. ................... | 438/4 |
| 2003/0096436 A1 * | 5/2003 | Satya et al. ................... | 438/11 |
| 2004/0152250 A1 * | 8/2004 | Steele et al. ................. | 438/200 |
| 2006/0105475 A1 * | 5/2006 | Ciplickas et al. .............. | 438/14 |
| 2006/0142971 A1 * | 6/2006 | Reich et al. .................. | 702/150 |

FOREIGN PATENT DOCUMENTS

| | | |
|---|---|---|
| JP | 2001-210097 | 8/2001 |
| JP | 2002-269109 | 9/2002 |

OTHER PUBLICATIONS

U.S. Patent Application for Hiroshi Matsushita et al., U.S. Appl. No. 10/107,297, filed Mar. 28, 2002.

U.S. Patent Application for Hiroshi Matsushita, U.S. Appl. No. 10/608,155, filed Jun. 30, 2003.

(Continued)

*Primary Examiner*—Scott B. Geyer
*Assistant Examiner*—Andre' Stevenson
(74) *Attorney, Agent, or Firm*—Finnegan, Henderson, Farabow, Garrett & Dunner, L.L.P.

(57) ABSTRACT

A failure analysis method according to the invention includes inputting the positions of failures in multiple wafers of an input device; preparing multiple sections in the multiple wafers; calculating feature amounts, which are represented by at least one numerical value representing a distribution of the failures in the multiple wafers, for each of the multiple sections; and representing by a first numerical value, the degree of similarity between the multiple wafers in terms of the feature amounts. Subsequently, the method includes detecting another wafer, which has the first numerical value greater than a predetermined first threshold, for each of the multiple wafers and forming a similar wafer group of multiple wafers with similar distributions of the failures.

15 Claims, 36 Drawing Sheets

OTHER PUBLICATIONS

K. Mitsutake, et al., "New Method of Extraction of Systematic Failure Component", Proc. 10$^{th}$ Int. Symp. Semiconductor Manufacturing, pp. 247-250, (2001).

M. Sugimoto et al., "Characterization Algorithm of Failure Distribution for LSI Yield Improvement", Proc. 10$^{th}$ Int. Symp. Semiconductor Manufacturing, pp. 275-278, (2001).

K. Nakamae, et al., "Fail Pattern Classification and Analysis System of Memory Fail Bit Maps", Proc. 4$^{th}$ Int. Conf. Modeling and Simulation of Microsystems, pp. 598-601, (2001).

Notification of Reason for Refusal issued by the Japanese Patent Office, dispatched on May 9, 2006, for Japanese Patent Application No. 2003-076411, and English-language translation thereof.

* cited by examiner

FIG. 17

|     | w1 | w2 | w3 | w4 |
|-----|----|----|----|----|
| w1  |    | ×  | ×  | ○  |
| w2  | ×  |    | ×  | ×  |
| w3  | ×  | ×  |    | ×  |
| w4  | ○  | ×  | ×  |    |

FIG. 18

| SIMILAR WAFER GROUP | NUMBER OF WAFERS | FAILURE CATEGORY | S1 | S4 | S2 | S3 |
|---|---|---|---|---|---|---|
| S1 | 2 | C1 |  | ○ | × | × |
| S4 | 2 | C1 | ○ |  | × | × |
| S2 | 1 | C2 | × | × |  | × |
| S3 | 1 | C3 | × | × | × |  |

| ORDER (CATEGORY) | NUMBER OF WAFERS | WAFER MAP |
|---|---|---|
| FIRST (C1) | 2 |  w1 |
| SECOND (C2) | 1 |  w2 |
| THIRD (C3) | 1 |  w3 |

FIG. 20

| SIMILAR WAFER GROUP | NUMBER OF WAFERS | FAILURE CATEGORY | S10 | S6 | S2 | S8 | S9 | S3 |
|---|---|---|---|---|---|---|---|---|
| S10 | 23 | C1 | ╲ | ○ | × | ○ | × | × |
| S6 | 19 | C1 | ○ | ╲ | × | ○ | × | × |
| S2 | 17 | C2 | × | × | ╲ | ○ | × | ○ |
| S8 | 15 | C1 | ○ | ○ | ○ | ╲ | × | ○ |
| S9 | 14 | C3 | × | × | × | × | ╲ | × |
| S3 | 12 | C2 | × | × | ○ | ○ | × | ╲ |

| ORDER (CATEGORY) | NUMBER OF WAFERS | WAFER MAP |
|---|---|---|
| FIRST (C1) | 31 |  |
| SECOND (C2) | 22 |  |
| THIRD (C3) | 16 |  |

Rac = 0.93

FIG. 41

|     | #4  | #5  | #6  | #7  |
|-----|-----|-----|-----|-----|
| #4  |     | ○   | ×   | ○   |
| #5  | ○   |     | ×   | ○   |
| #6  | ×   | ×   |     | ×   |
| #7  | ○   | ○   | ×   |     |

FIG. 42

| SIMILAR LOT SET | NUMBER OF LOTS | FAILURE CATEGORY | S4 | S5 | S7 | S6 |
|---|---|---|---|---|---|---|
| S4 | 3 | G1 |  | ○ | ○ | × |
| S5 | 3 | G1 | ○ |  | ○ | × |
| S7 | 3 | G1 | ○ | ○ |  | × |
| S6 | 1 | G2 | × | × | × |  |

US 7,405,088 B2

METHOD FOR ANALYZING FAIL BIT MAPS OF WAFERS AND APPARATUS THEREFOR

CROSS REFERENCE TO RELATED APPLICATIONS

This application is based upon and claims the benefit of priority from prior Japanese Patent Applications No. P2003-76411, filed on Mar. 19, 2003; the entire contents of which are incorporated herein by reference.

BACKGROUND OF THE INVENTION

1. Field of the Invention

The present invention relates to a failure analysis method that classifies wafer failure distributions in units of wafers and also in units of lot.

2. Description of the Related Art

In order to enhance LSI yields, clarification of the cause of deterioration in the yields, early identification of a problematic LSI manufacturing process, a problematic manufacturing device, or a problematic design condition, and improvement thereof are critical. As LSI miniaturization progresses, various failures that reduce the LSI yields have become obvious. Failure information including the test results of LSI wafers, in particular, memory products, which have been tested by a tester immediately after completion of a wafer process, is mapped into a fail bit map (FBM). Analysis of the FBM and a defect map of wafer defects developed inline during the manufacturing process is critical to improvement of preventing failures.

Wafer failure distributions of the FBM and the defect map can be categorized as either random distribution failures or clustering distribution failures. It is thought that clustering distribution represents a systematic factor due to a manufacturing process or a manufacturing device. The clustering distribution is a significant cause of reduction in the LSI yields.

Therefore, detection of clustering failures from the failure distribution is the first step to identify the cause of failures; a detection method thereof has been proposed.

Failures due to a manufacturing process or a manufacturing device develop manufacturing process- or manufacturing device-specific wafer failure distribution. Therefore, failure pattern analysis of the clustering distribution may be thought of as a clue to identify the cause of failure.

As the second step to identify the cause of failure, the clustering distribution is subjected to failure pattern analysis. This is capable of identifying a bit failure, a row failure, and a column failure according to which the FBMs for memory products may be microscopically classified, an open/short interconnects that may be a physical cause thereof, and a layer damaged therefrom. In addition, macroscopic classification of FBM distribution of wafers is made to identify the cause of failure. It has been reported that the waveform of the probability distribution function in terms of the distance between failure bits in the FBM can be classified according to seven certain failure modes.

It has been reported that classification according to fifty-five failure modes can be made by combining the failure distribution in a wafer resulting from macroscopically classifying the FBM, and microscopic classification thereof. Failure patterns have been classified using an artificial neural network, with the FBM as a picture image.

Alternatively, a fail bit count (FBC) data method that counts the number of failure bits for every minutely divided section in the memory products has been proposed.

It has been reported that an usage of FBC data allows classification according to various failure modes, such as lithography-caused failure.

SUMMARY OF THE INVENTION

An aspect of the present invention inheres in a failure analysis method including inputting the positions of failures in a plurality of wafers; preparing a plurality of sections in the plurality of wafers, calculating feature amounts, which are represented by at least one numerical value representing a distribution of the failures in the plurality of wafers, for each of the plurality of sections, representing by a first numerical value, the degree of similarity between the plurality of wafers in terms of the feature amounts, and detecting another wafer, which has the first numerical value which is greater than a predetermined first threshold, for each of the plurality of wafers and forming a similar wafer group of the plurality of wafers with similar distributions of the failures.

Another aspect of the present invention inheres in a failure analysis apparatus including an input/output unit, which inputs the positions of failures in a plurality of wafers, a partitioning unit, which prepares a plurality of sections in the plurality of wafers, a generalized feature amount calculation unit, which calculates for each of the sections, feature amounts that are represented by at least one numerical value representing the distribution of the failures in the plurality of wafers, an inter-wafer correlation coefficient calculation unit, which represents by a first numerical value, the degree of similarity among the plurality of wafers in terms of the feature amounts, and a similar wafer group generation unit, which detects for each of the plurality of wafers, another wafer, which allows the first numerical value to be greater than a predetermined first threshold, so as to form a similar wafer group of wafers with similar failure distributions.

A still another aspect of the prevent invention inheres in a computer program product for failure analysis including program instructions for: inputting the positions of failures in a plurality of wafers; preparing a plurality of sections in the plurality of wafers; calculating for each of the sections, feature amounts that are represented by at least one numerical value representing the distribution of failures in the plurality of wafers; representing by a first numerical value, the degree of similarity between the plurality of wafers in terms of the feature amounts; and detecting another wafer, which has the first numerical value greater than a predetermined first threshold, for each of the plurality of wafers and forming a similar wafer group of the plurality of wafers with similar distributions of the failures.

BRIEF DESCRIPTION OF DRAWINGS

FIG. 17 is a table showing whether or not the wafers of Example 1 are similar to each other;

FIG. 18 is a table for describing generation of the similar wafer groups and failure categories of Example 1;

FIG. 20 is a table for describing generation of similar wafer groups and failure categories of Example 2;

FIG. 41 is a table showing whether or not the lots of Example 7 are similar to one another; and FIG. 42 is a table for describing generation of the similar lot groups and failure categories of Example 7.

DETAILED DESCRIPTION OF THE INVENTION

Figure 1:
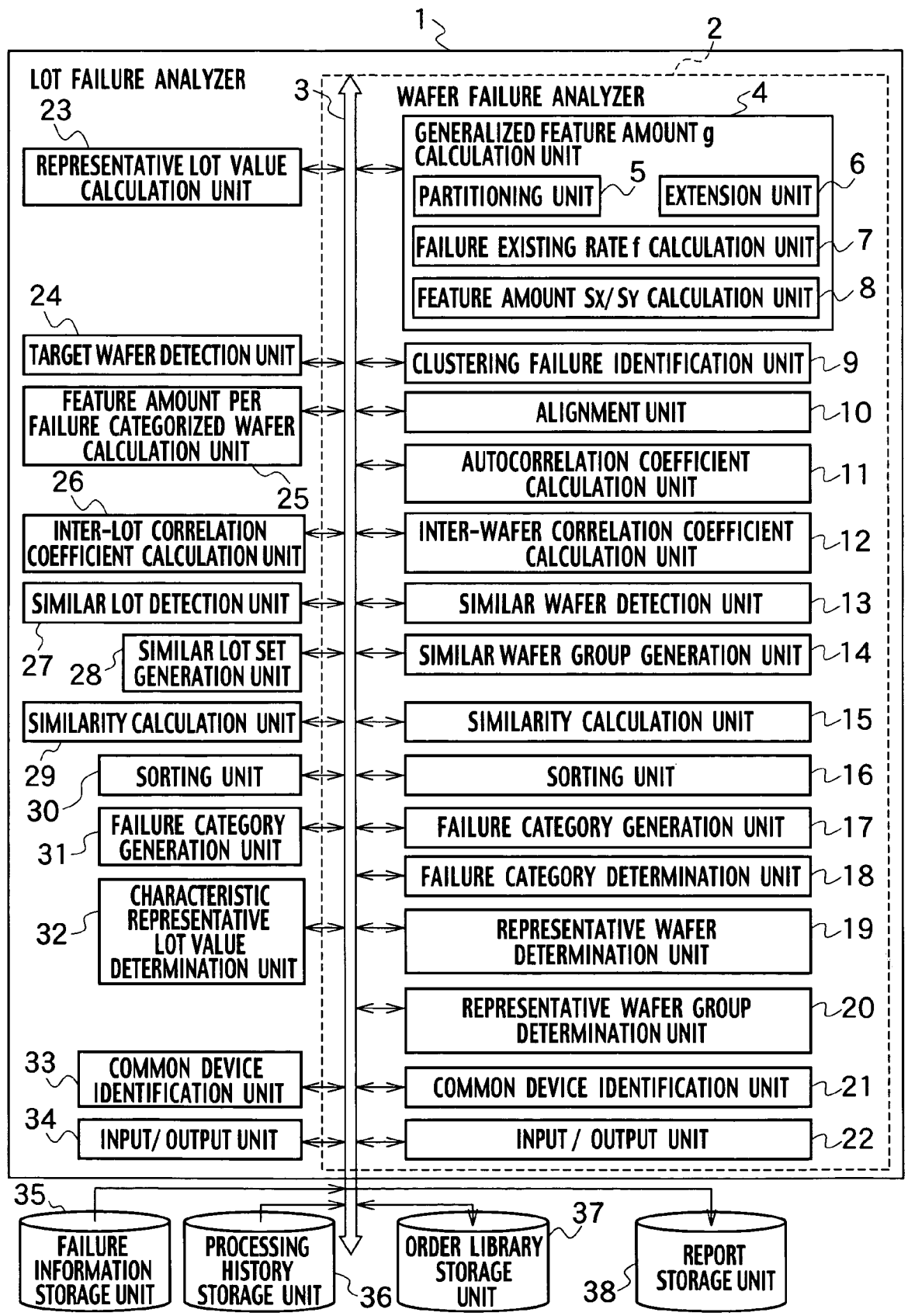
FIG. 1 is a block diagram of a failure analyzer according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Clustering Distribution not Detected by Feature Amount)

There are various causes of LSI failures, since there are several hundreds of manufacturing devices to manufacture the LSIs. Correspondingly, there are various failure clustering distribution patterns. In order to examine the cause of failure, an algorithm to detect wafers with a specific failure clustering distribution pattern is necessary. Usage of feature amounts obtained by changing the failure distribution pattern to corresponding numerical values allows detection of wafers with a specific failure clustering distribution pattern. The "feature amounts" is defined as the numerical values corresponding to the feature distribution pattern. The use of the term "feature" refers to features of the failure distribution pattern. Examples will be discussed below. However, usage of the feature amounts representing that specific failure distribution pattern does not allow detection of failure distribution patterns, other than the failure distribution pattern of interest. In addition, even when a calculation algorithm that finds various feature amounts and then categorizes the features is prepared in advance for various failure clustering distribution patterns, an unexpected failure distribution pattern cannot be detected.

Accordingly, it is desirable to generate feature amounts capable of detecting even an unexpected failure distribution pattern.

(Importance of Identifying Failure Development Patterns in Lot Units)

In an LSI manufacturing line of a plant for an LSI manufacturing process, that process is performed for each lot of wafers, where a single lot includes 25 wafers. When the manufacturing device malfunctions, failures that match a specific failure clustering distribution may be developed in each wafer lot. The following feature may be found in the intra-lot failure distribution patterns. When one of two chambers in a manufacturing device malfunctions, failures that match a failure clustering distribution may be developed, for example, on only wafers with even wafer numbers attached to the wafers in the intra-lot processing order. As described above, intra-lot failure development patterns have a close relationship with malfunctions of a manufacturing device. Therefore, in order to identify the cause of a detected failure with failure clustering distribution, not only detection of wafers with a similar failure development pattern, but also detection of lots with a similar failure development pattern is critical. More specifically, failures with a failure clustering distribution are quantified as feature amounts for each wafer, and those feature amounts of failures are also reflected in each lot. This may allow identification of a manufacturing process that is the cause of failures.

(Wafer Failure Analyzer)

As shown in FIG. 1, a wafer failure analyzer 2 of an embodiment of the present invention has a bus 3, a generalized feature amount calculation unit 4, a clustering failure identification unit 9, an alignment unit 10, an autocorrelation coefficient calculation unit 11, an inter-wafer correlation coefficient calculation unit 12, a similar wafer detection unit 13, a similar wafer group generation unit 14, a similarity calculation unit 15, a sorting unit 16, a failure category generation unit 17, a failure category determination unit 18, a representative wafer determination unit 19, a representative wafer group determination unit 20, a common device identification unit 21, and an input/output unit 22. The generalized feature amount calculation unit 4 has a partitioning unit 5, an extension unit 6, a failure rate calculation unit 7, and a feature amount Sx/Sy calculation unit 8.

The wafer failure analyzer 2 may further have a failure information storage unit 35, a process history storage unit 36, an order library storage unit 37, and a report storage unit 38. Alternatively, as shown in FIG. 1, the failure information storage unit 35, the process history storage unit 36, the order library storage unit 37, and the report storage unit 38 may be provided outside the wafer failure analyzer 2, and may be connected thereto.

The wafer failure analyzer 2 may be a computer. The wafer failure analyzer 2 may be implemented by instructing the computer to execute a sequence described by a program.

(Lot Failure Analyzer)

As shown in FIG. 1, a lot failure analyzer 1 of the embodiment of the present invention has the wafer failure analyzer 2. In addition to the wafer failure analyzer 2, the lot failure analyzer 1 further has a representative lot value calculation unit 23, a target wafer detection unit 24, a feature amount per failure categorized wafer calculation unit 25, an inter-lot correlation coefficient calculation unit 26, a similar lot detection unit 27, a similar lot set generation unit 28, a similarity calculation unit 29, a sorting unit 30, a failure category generation unit 31, a characteristic representative lot value determination unit 32, a common device detection unit 33, and an input/output unit 34.

The lot failure analyzer 1 may be a computer. The lot failure analyzer 1 may be implemented by instructing the computer to execute a sequence described by a program.

(Wafer Failure Analysis Method)

Figure 2:
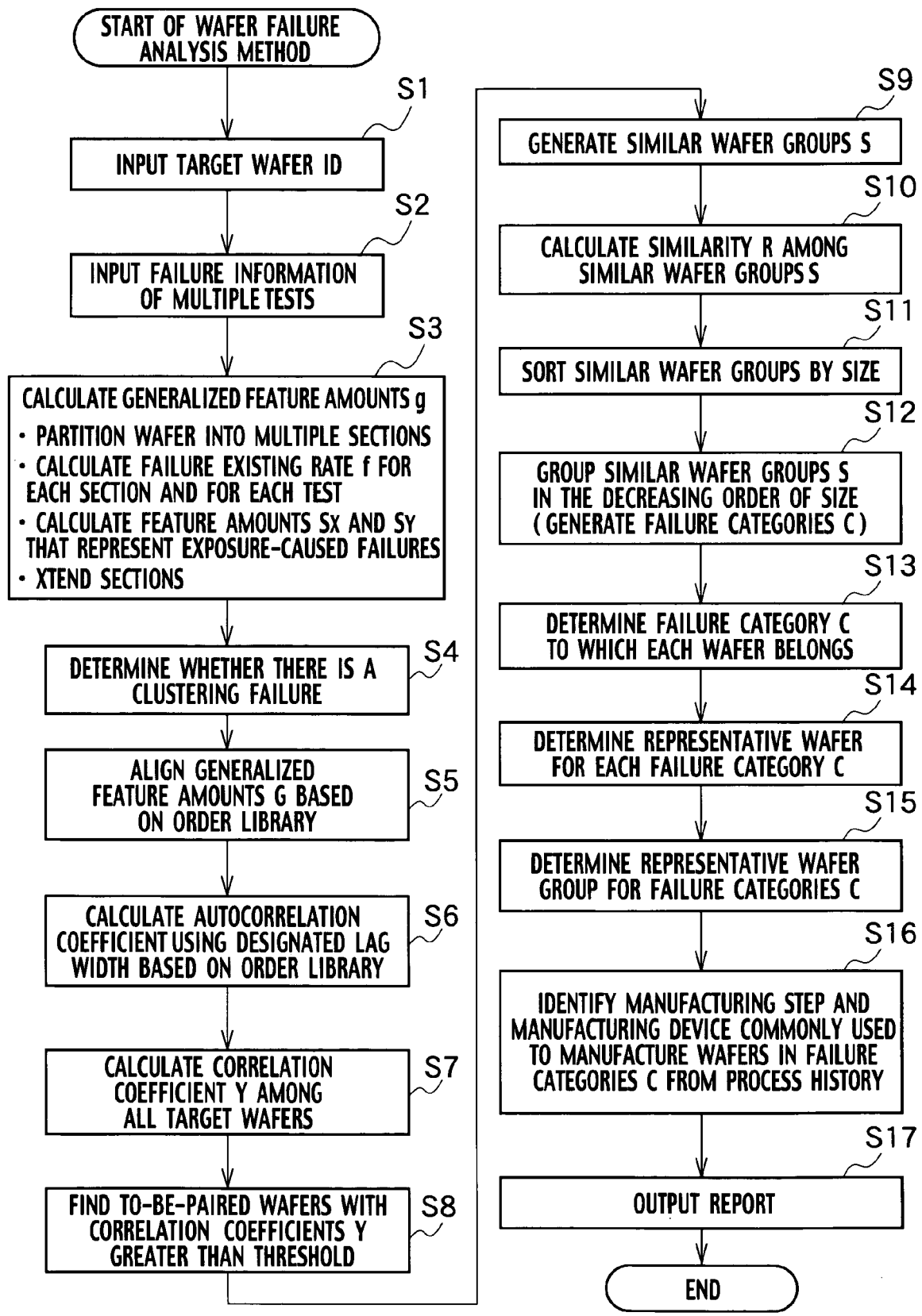
FIG. 2 is a flowchart for a wafer failure analysis method according to an embodiment of the present invention.

As shown in FIG. 2, with a wafer failure analysis method of the embodiment of the present invention, to begin with, the input/output unit 22 receives a target wafer ID in step S1.

In step S2, the failure information storage unit 35 receives failure information of multiple tests. More specifically, the positions of failures in multiple wafers are input.

In step 3, the generalized feature amounts g are calculated by the generalized feature amount g calculation unit 4. In other words, the respective wafers are partitioned into multiple sections, and a failure rate is calculated for each section of the wafers. More specifically, a rate of failures existing within each section f is calculated for each of the multiple tests. This failure existing rate f is calculated as a ratio of the number of failure bits developed within each section to the number of all bits existing within the tested section. The first autocorrelation function in terms of the feature amounts Sx and Sy that represent exposure-caused failures is calculated for each section using an exposure cycle period as a lag. Each section is then extended. The number of failures developed within each extended section is used to calculate again the failure existing rate f. In the extended section, the area overlapped with the adjacent section is 60% or less than the area of the original section.

In step S4, the clustering failure identification unit 9 determines whether there is a failure with a failure clustering distribution. In other words, frequency distribution of the failure existing rate f is generated for each wafer, and a logarithm of this frequency distribution is approximated with a quadratic function. The second-order and the first-order coefficient of this quadratic function are then calculated, and whether there is a clustering failure is determined based on the second-order and the first-order coefficients.

In step S5, the order in which the alignment unit 10 aligns the failure existing rate f and the lag width are stored in an order library. In this order, the rates of failures existing within the respective sections f that are relevant to one another are aligned sequentially. The generalized feature amounts g are aligned based on the order library. The failure existing rates f are aligned for each wafer based on the orders stored in the order library, so as to form a waveform.

In step S6, the autocorrelation coefficient calculation unit 11 calculates the autocorrelation coefficients for the formed waveform based on the designated lag width stored in the order library.

In step S7, the inter-wafer correlation coefficient calculation unit 12 represents the degree of similarity between wafers in terms of the failure existing rates f as a numerical value. This numerical value may be correlation coefficients Y for all target wafers in terms of the failure existing rates f. Alternatively, this numerical value may be calculated by Fouriertransforming waveforms of the failure existing rates f and then comparing the first spectra of waveforms with each other. In this case, the numerical value is an agreement level between the spectra. Alternatively, the numerical value may be calculated using the maximum entropy method.

In step S8, the similar wafer detection unit 13 detects wafers to-be-paired with the correlation coefficient Y which greater than a certain threshold.

In step S9, the similar wafer group generation unit 14 generates similar wafer groups S each including wafers with similar failure distributions by detecting for each wafer a corresponding wafer which has a larger correlation coefficient Y than a predetermined threshold.

In step S10, the similarity calculation unit 15 calculates a similarity R among the similar wafer groups S, the ratio of the number of wafers belonging to both a similar wafer group and another similar wafer group to number of wafers belonging to either a similar wafer group or another similar wafer group. This similarity R among the similar wafer groups S allows extraction of other similar wafer groups which exceed a predetermined threshold.

In step S11, the sorting unit 16 sorts the similar wafer groups S by size.

In step S12, the failure category generation unit 17 groups the similar wafer groups S in the order of size, and generates a failure categories C. More specifically, the first failure category is configured by the similar wafer group and the other similar wafer groups that are extracted for that former similar wafer group, which are sorted in a decreasing order of the number of wafers belonging to each similar wafer group.

In step S13, the failure category determination unit 18 determines the failure category C to which each wafer belongs.

In step S14, the representative wafer determination unit 19 determines a representative wafer for each failure category C.

In step S15, the representative wafer group determination unit 20 determines the representative wafer group of the failure categories C.

In step S16, the common device identification unit 21 identifies, from process history manufacturing steps and manufacturing devices, the devices that are commonly used to manufacture the wafers belonging to the same failure category C.

In step S17, the input/output unit 22 outputs a failure analysis report.

The wafer failure analysis method can be represented by a wafer failure analysis program sequence, which can be executed by a computer. The wafer failure analysis method can be implemented by having the computer execute the wafer failure analysis program sequence.

(Lot Failure Analysis Method)

Figure 3:
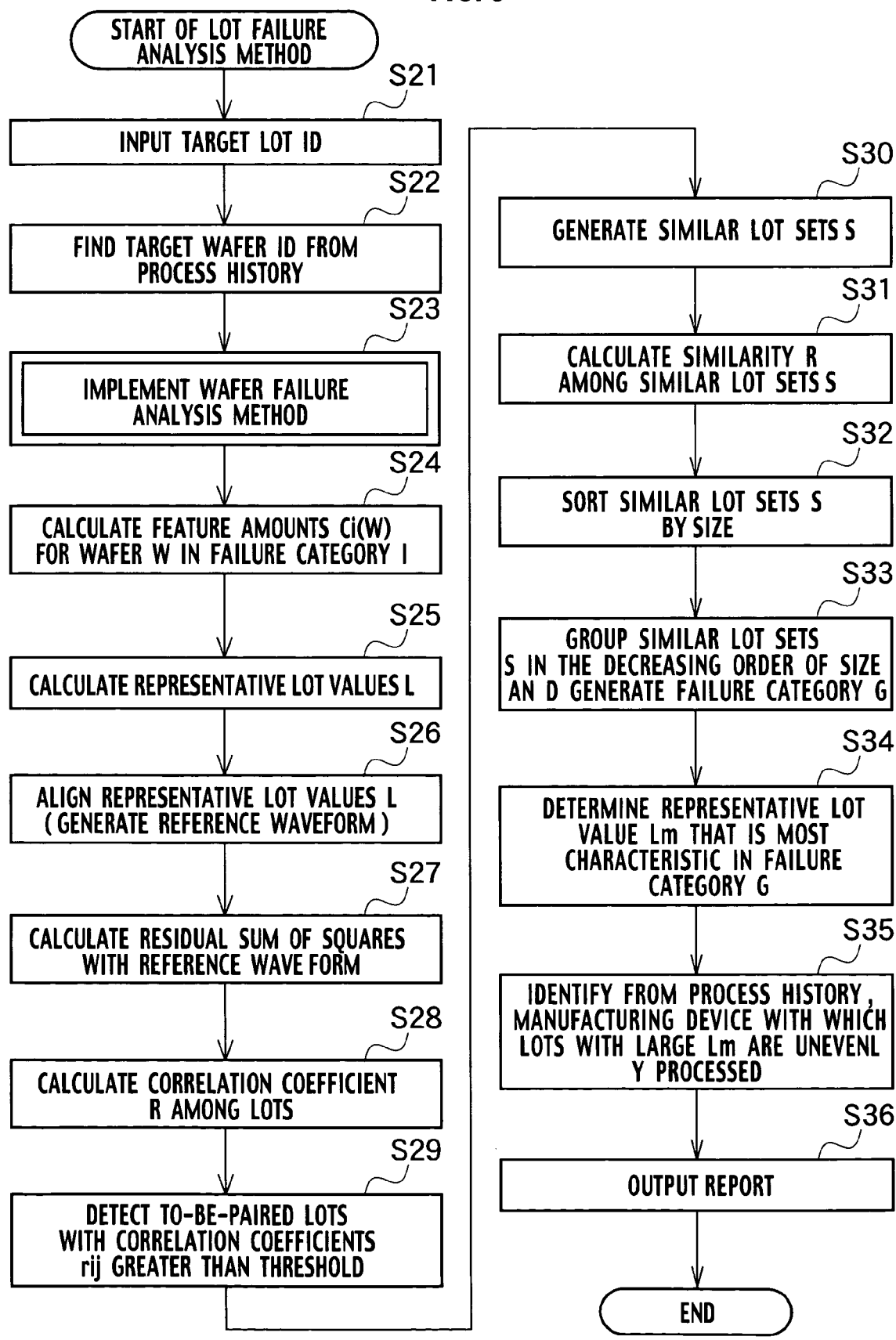
FIG. 3 is a flowchart for a lot failure analysis method according to an embodiment of the present invention.

As shown in FIG. 3, with a lot failure analysis method of the embodiment of the present invention, to begin with, a target lot ID is input via the input/output unit 34 in step S21.

In step S22, the target wafer detection unit 24 finds a target wafer ID from a process history.

In step S23, the wafer failure analyzer 2 implements the wafer failure analysis method.

In step S24, the feature amount per failure categorized wafer calculation unit 25 calculates the feature amounts Ci (w) in terms of wafer w in failure category i (i corresponds to C in Example 1). More specifically, the ratio of the number of wafers belonging to the failure category i with the numerical value representing the degree of similarity among wafers that is greater than the predetermined threshold to the total number of wafers belonging to the failure category i is calculated as a feature amount Ci (w) for each wafer. In addition, the failure category I, to which no wafers belong, is set to zero.

In step S25, the representative lot value L calculation unit 23 calculates the representative lot value L for a wafer lot. At least one of average lot value, a wafer failure rate per lot, the intra-lot maximum value, degree of even/odd-caused inhomogeneous distribution, degree of first/latter half-caused inhomogeneous distribution, degree of wafer number-caused inhomogeneous distribution, or a periodic regularity is used as a feature amount Ci (W) for a wafer w for calculation of each representative lot value L.

In step S26, the representative lot value L calculation unit 23 aligns the representative lot values L so as to form a waveform for each lot. More specifically, the representative lot values L for a lot are sorted in decreasing order, so as to form a reference waveform.

In step S27, the representative lot value L calculation unit 23 calculates an error sum of squares from the waveform sorted in the corresponding order to the reference waveform formed for each lot and that reference waveform.

In step S28, the inter-lot correlation coefficient calculation unit 26 calculates a coefficient which represents the degree of similarity in representative lot value L between lots as a numerical value. This numerical value may be a correlation coefficient r in a representative lot value L among all of the lots. Alternatively, the numerical value may be calculated by Fouriertransforming the waveform of the representative lot values L and then comparing the second spectra with each other. Alternatively, this numerical value may be found using the maximum entropy method.

In step S29, the similar lot detection unit 27 detects lots to-be-paired with a correlation coefficient rij equal to or greater than the threshold of the correlation coefficient rij.

In step S30, the similar lot set generation unit 28 detects another lot with a correlation coefficient rij, which represents the degree of similarity between lots, equal to or greater than a predetermined threshold for each lot. The single lot and the detected other lots form a lot set S with a similar failure development pattern.

In step S31, the similarity calculation unit 29 calculates as the similarity R among the similar lot sets S, the ratio of the number of lots commonly belonging to those two similar lot sets S to the number of lots belonging to either of those sets S. Other lot sets with a similarity R from among the similar lot sets S equal to or greater than a predetermined threshold are detected.

In step S32, the sorting unit 30 sorts the similar lot sets S by size.

In step S33, the failure category generation unit 31 groups the similar lot sets S in decreasing order of size. A failure category G is configured with the similar lot sets S and other similar lot sets S detected with respect thereto in a decreasing order of the number of lots belonging to the similar lot sets S.

In step S34, the characteristic representative lot value determination unit 32 calculates the first total sum of the numerical values, each representing the degree of similarity in representative lot value L among all of the lots belonging to the failure category G, and the second total sum of numerical values, each representing the degree of similarity among lots when one component is excluded from the representative lot values L. One of the representative lot values L that provides the largest difference between the first and the second total sum is calculated. The calculated representative lot value L is determined as the representative lot value Lm that is the most characteristic in the failure category G.

In step S35, the common device identification unit 33 identifies, from the process history, a manufacturing device by which the lots with a large representative lot value Lm, which is the most characteristic in the failure category G, are unevenly processed. A manufacturing step and a manufacturing device commonly used to manufacture the lots belonging to the failure category G are identified from the process history.

In step S36, the input/output unit 34 outputs a report to the report storage unit 38.

The lot failure analysis method can be represented by a lot failure analysis program sequence, which can be executed by a computer. The lot failure analysis method can be implemented by making the computer execute this program.

As mentioned above, according to the failure analysis method of the embodiment, failure distribution developed in each wafer can be automatically classified in units of wafer and in units of lot.

According to the failure analyzer of the embodiment, failure distribution developed in each wafer can be automatically classified in units of wafer and in units of lot.

According to the failure analysis program of the embodiment, failure distribution developed in each wafer can be automatically classified in units of wafer and in units of lot.

EXAMPLE 1

In Example 1, the wafer failure analyzer 2 in FIG. 1 and the wafer failure analysis method in FIG. 2 are described. In Example 1, wafer failure distribution is represented by a lot of numerical value groups, and wafers with similar failure distributions are automatically identified.

In step S1, a target wafer ID is input to the input/output unit 22.

In step S2, failure information as shown in FIGS. 4 through 7 is input from the failure information storage unit 35. The failure information includes wafer failure position data, which is identified within a wafer indication region 41 and a failure indication region 42. This failure information is formed based on the FBM of the failure bits in certain semiconductor memory products, which have been tested after completion of a wafer manufacturing process, and stored in the failure information storage unit 35. The wafer indication region 41 shows an existing wafer region. The failure indication region 42 shows failure bit positions. It is found that the failure information includes failure bits with random distribution and failure bits with clustering distribution.

Figure 4:
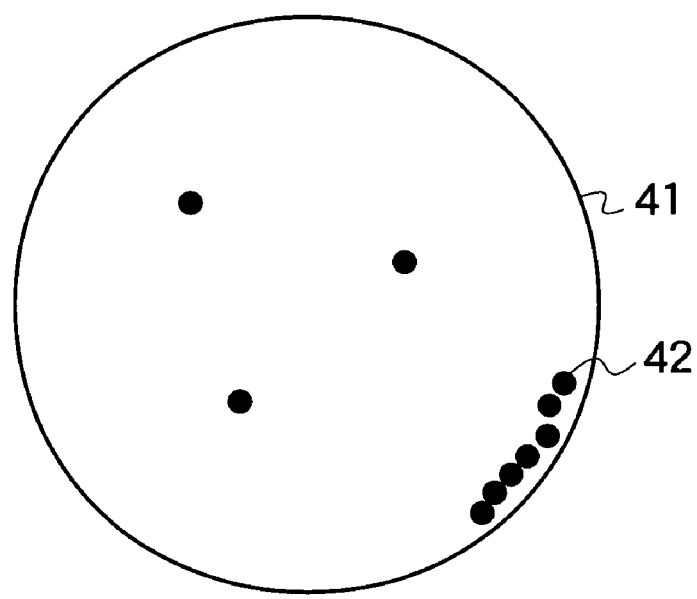
FIGS. 4 through 7 are diagrams showing wafer failure distributions of Example 1.
Figure 6:
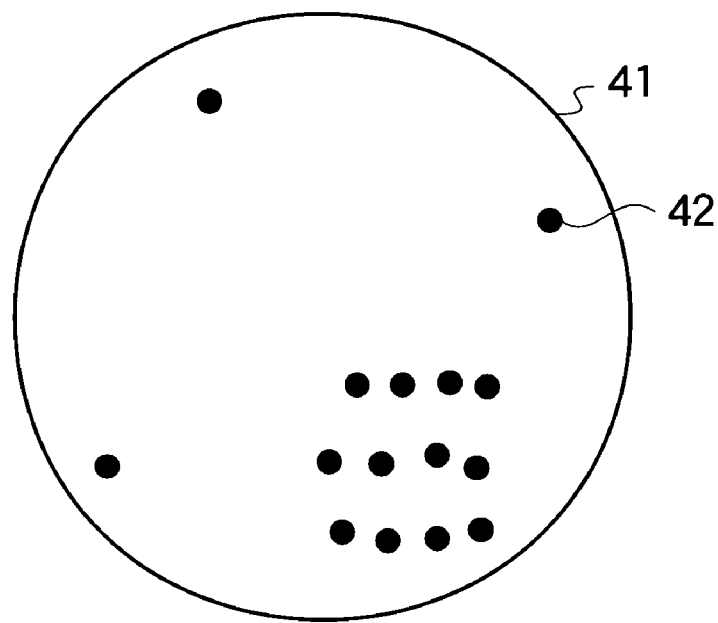
Figure 7:
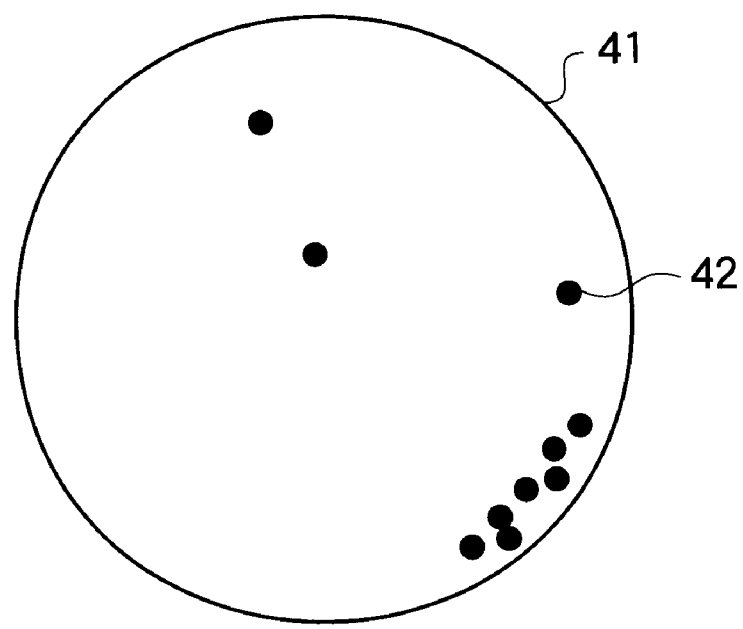

Moreover, it is determined that the wafers in FIGS. 4 and 7 include failure bits with clustering distribution at the outer regions of the wafers. Furthermore, it is determined that the wafer in FIG. 5 includes failure bits with clustering distribution at the center of the wafer. In FIG. 6, it is determined there are failure bits with clustering distribution at the lower right of the wafer. In addition, the wafer in FIG. 6 has failure bits that are distributed at regular intervals, and those intervals agree with an exposure cycle period in an exposure process. Accordingly, the failure bits in FIG. 6 are exposure-caused failures. In this way, it is determined that there are various failure distribution patterns for clustering failures. From the view of the cause of failures developed with clustering distribution, it is expected that the failures in FIGS. 4 and 7 may be caused by a manufacturing step or a manufacturing device in the same manufacturing process. On the other hand, the failures in FIGS. 4 through 6 may be caused by a different manufacturing step or manufacturing device, respectively. In order to identify the cause of failures developed with clustering distribution, wafers with similar failure clustering distribution should be identified, and a manufacturing step or a manufacturing device commonly used for the identified wafers should be identified based on the process history of the wafer manufacturing processes stored in the process history storage unit 36.

In step 3, the generalized feature amounts g are calculated by the generalized feature amount g calculation unit 4. In order to quantitatively represent the similarity, that is, whether or not the failure clustering distributions have similarity, the failure clustering distributions are represented by the generalized feature amounts g, which are a lot comprised of numerical value groups.

Figure 8:
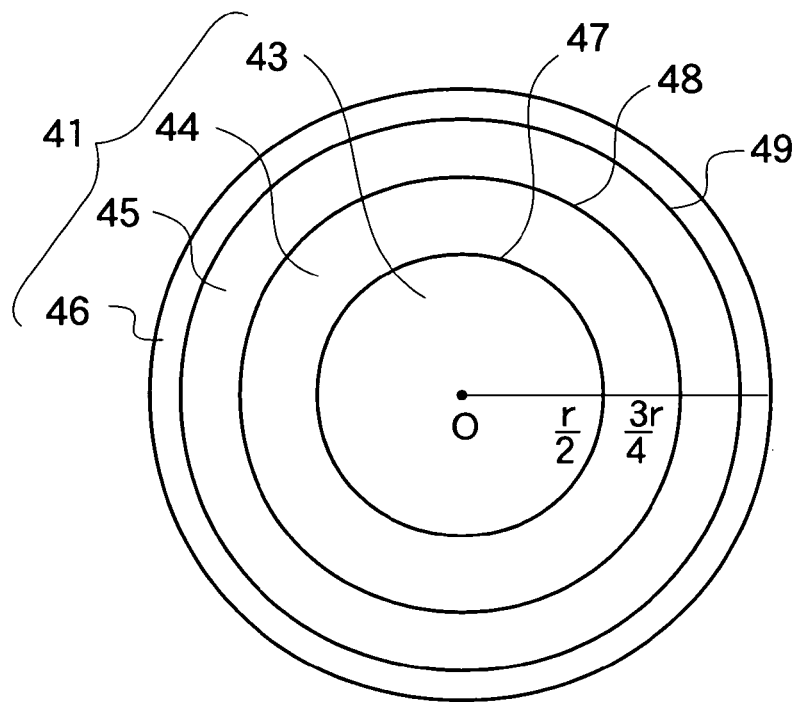
FIG. 8 is a diagram for describing sections partitioned with concentric circles of Example 1.

To begin with, a wafer is partitioned into multiple sections. As shown in FIG. 8, a boundary line 47 is provided (½)r that is spaced from the center of the wafer along the radius; a boundary line 48 is provided (¾)r that is spaced from the center of the wafer along the radius; and a boundary line 49 is provided, so as to partition chips, which are deployed in the outermost region of the wafer so as to contact the wafer edge, and other chips located interiorly of the wafer edge; where r denotes the radius of the wafer. Those three boundary lines 47 through 49 partition the wafer indication region 41 into ring-shaped regions 43 through 46.

Next, eight boundary lines 61 through 68 are provided so that the wafer is divided into 45 degree angles. Those eight boundary lines 61 through 68 partition the wafer indication region 41 into eight fan-shaped regions 51 through 58.

Figure 9:
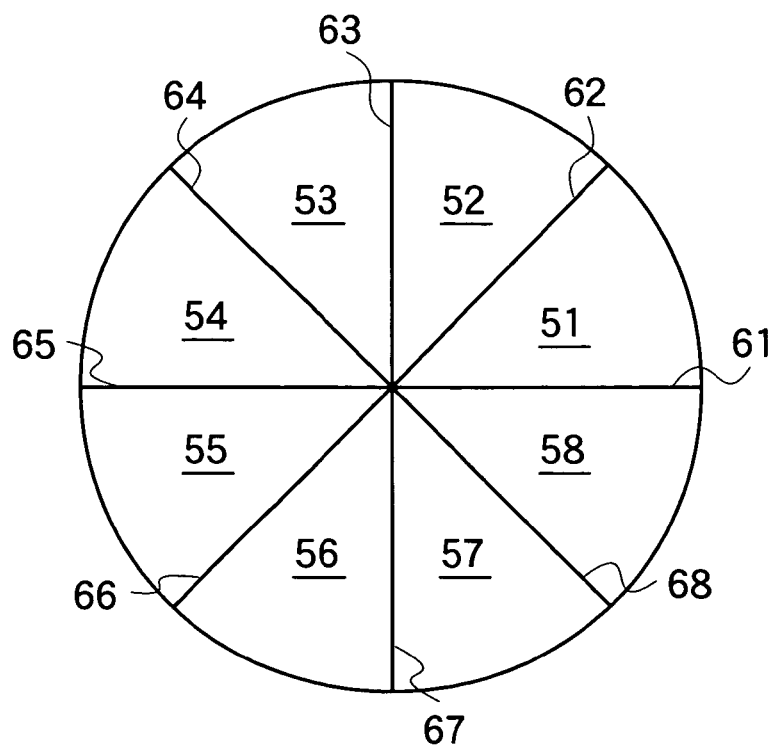
FIG. 9 is a diagram for describing sections of Example 1, which are partitioned based upon chords.
Figure 10:
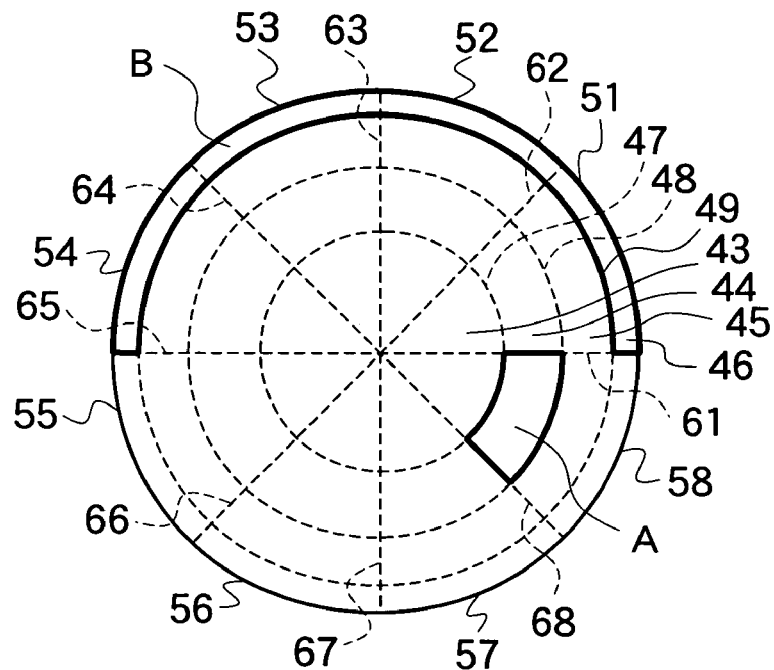
FIG. 10 is a diagram for describing sections of Example 1, which are partitioned based upon concentric circles and chords.

As shown in FIG. 10, sections in FIGS. 8 and 9 are integrated into a total of 104 defined sections. For example, section A is defined as the logical product of section 44, which is located between (½)r and (¾)r spaced from the center along the radius, and section 58, which is located between an angle of 315 degrees and an angle of 360 degrees. Section B is defined as the logical product of a wafer edge section 46, which extends along the radius, and sections 51 through 54, which extend between an angle of 0 degrees and an angle of 180-degrees. Similarly, the other sections can be defined as the logical product of sections partitioned along the radius and sections partitioned with a fixed angle.

Figure 11:
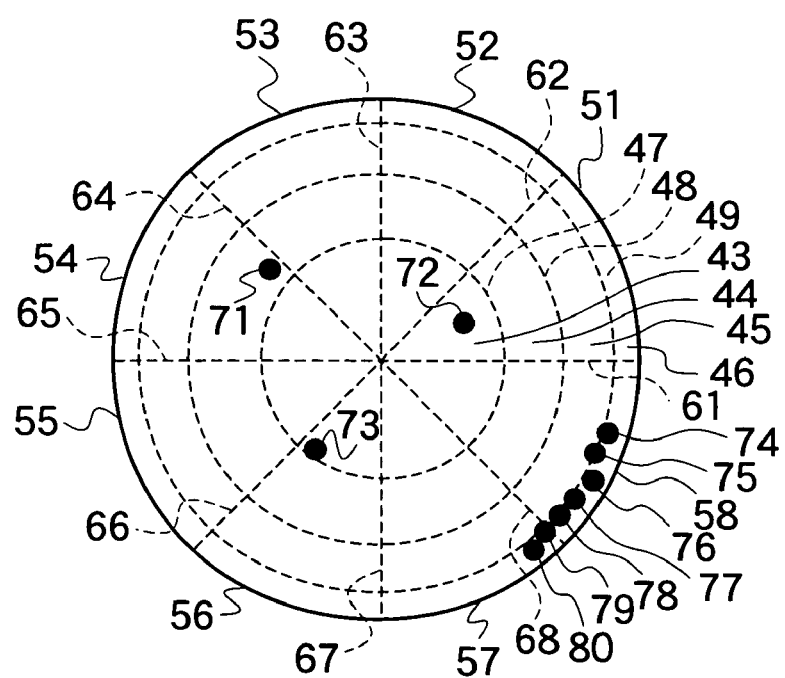
FIG. 11 is a diagram for describing a method of finding generalized feature amounts of wafer failure distribution based on sections of Example 1.
Figure 12A:
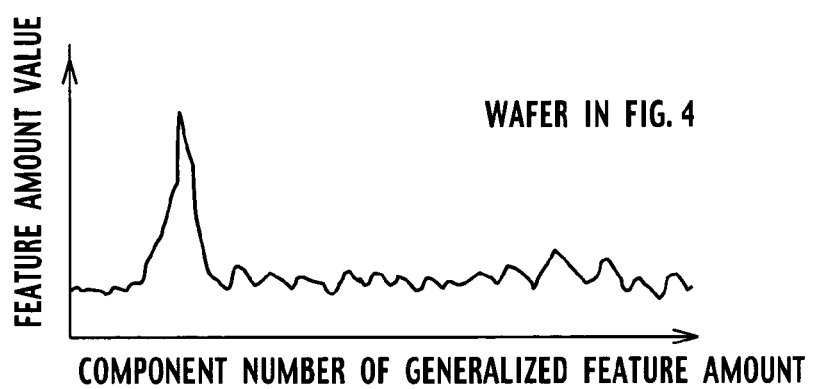
FIGS. 12A through 12D are waveforms representing the generalized feature amounts of Example 1.
Figure 12B:
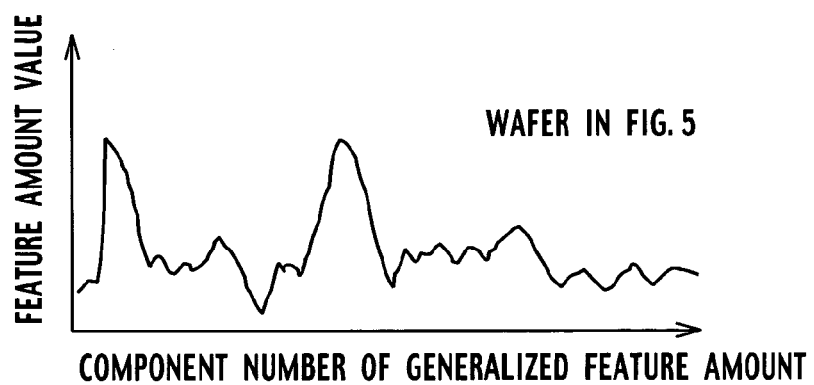
Figure 12C:
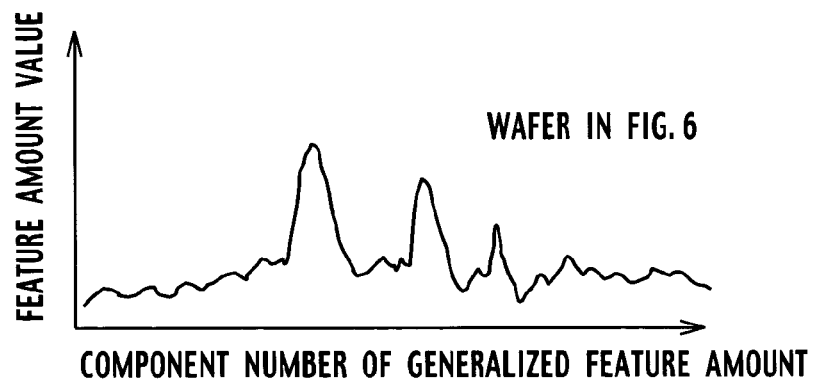
Figure 12D:
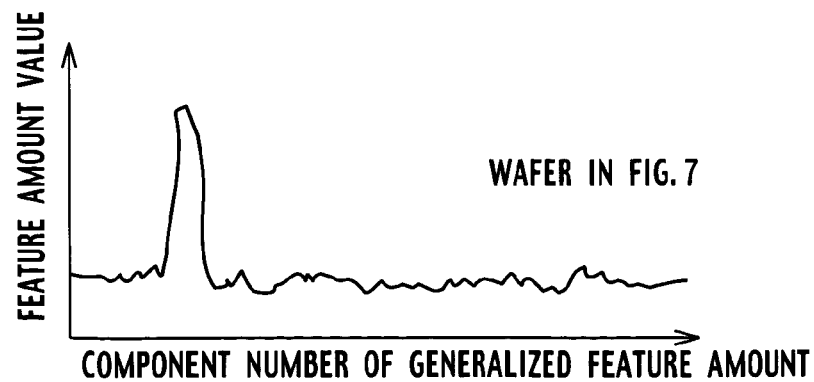

Next, as shown in FIG. 11, the failure indication region 42 in FIG. 4 and positions of failures in the sections in FIG. 10 are compared to find a failure bit existing rate $f_i$ for each of 104 sections i. The failure bit existing rate $f_i$ is calculated using the following Expression (1), where $nr_i$ denotes the number of all bits belonging to a section i, and $nf_i$ denotes the total number of failure bits developed in a section i.

$$f_i = nf_i / nr_i \qquad (1)$$

Where i of the section i denotes a number assigned to each section.

For example, failure bit 71 is located in section 1, which is the logical product of sections 44 and 54. When the number of all bits belonging to section 1 is ten, the failure bit existing rate $f_1$ is 1/10 or 0.1. Failure bit 72 is located in section 2, which is the logical product of sections 43 and 51. When the number of all bits belonging to section 2 is ten, the failure bit existing rate $f_2$ is 1/10 or 0.1. Failure bit 73 is located in section 3, which is the logical product of sections 43 and 56. When the number of all bits belonging to section 3 is ten, the failure bit existing rate $f_3$ is 1/10 or 0.1. Failure bits 74 through 78 are located in section 4, which is the logical product of sections 46 and 58. When the number of all bits belonging to section 4 is ten, the failure bit existing rate $f_4$ is 5/10 or 0.5. Failure bits 79 and 80 are located in section 5, which is the logical product of sections 46 and 57. When the number of all bits belonging to section 5 is ten, the failure bit existing rate $f_5$ is 2/10 or 0.2. Failure bits 74 through 80 are located in section 6, which is the logical product of section 46 and sections 57 and 58. When the number of all bits belonging to section 6 is twenty, the failure bit existing rate $f_6$ is 7/20 or 0.35. Failure bits 74 through 78 are located in section 7, which is the logical product of section 46 and sections 51 and 58. When the number of all bits belonging to section 7 is twenty, the failure bit existing rate $f_7$ is 5/20 or 0.25. The generalized feature amounts g are configured with the failure bit existing rates $f_i$.

Wafer tests for searching failure bits are performed for various kinds of electrical characteristics. The wafer test includes, for example, a function test that determines whether or not each bit functions as memory, or a margin test that determines whether or not an operating time or an electric current value satisfies the product standard even when each bit functions as memory. The failure existing rate f in Expression (1) is calculated for each wafer test and each wafer. As shown in FIGS. 12A through 12D, feature amount values or the values of the generalized feature amounts g are aligned in a row in a fixed order among wafers, and each waveform shown by a polygonal line is formed for each wafer. Those waveforms may be regarded as the waveforms of the generalized feature amounts g. Therefore, quantification of the similarity between wafers can be thought of as quantification of the similarity of the waveforms of the generalized feature amounts g. It can be seen from FIGS. 12A and 12D that the waveforms of the generalized feature amounts g for wafers in FIGS. 4 and 7 are similar to one another.

Note that the waveforms of the generalized feature amounts g change depending on how to align components gi of the generalized feature amounts g. In Example 1, selecting each section in turn from the adjacent sections, which is the logical product of sections 43 and 51, in a counterclockwise and spirally proceeding order, each corresponding component gi of the generalized feature amounts g is aligned. Regarding alignment for different wafer tests, to begin with, the components gi of the generalized feature amounts g for the same wafer test are aligned such that they are positioned next to each other. As to aligning differing wafer tests, similar wafer tests are arranged next to each other. This allows reduction in high-frequency components of the waveform.

Figure 13:
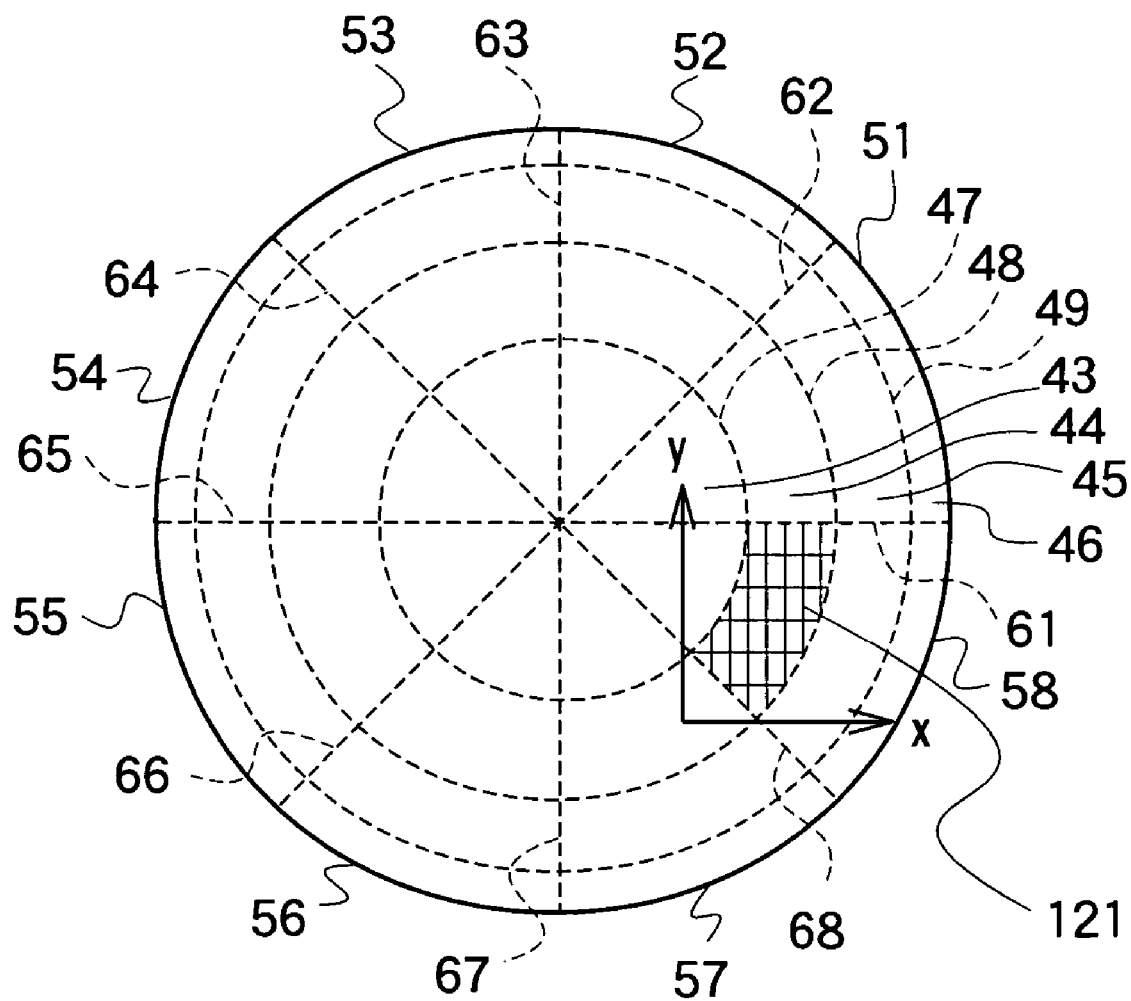
FIG. 13 is a x-y coordinate system and segments for finding feature amounts that represent exposure-caused failure of Example 1.

Next, as shown in FIG. 13, the section that is the logical product of sections 44 and 58, for example, is partitioned into minute segments 121, each having a size matching the exposure cycle period, in order to detect features of the exposure-caused failures. The directions of the exposure cycle periods are set to x and y axes, respectively.

Figure 14:
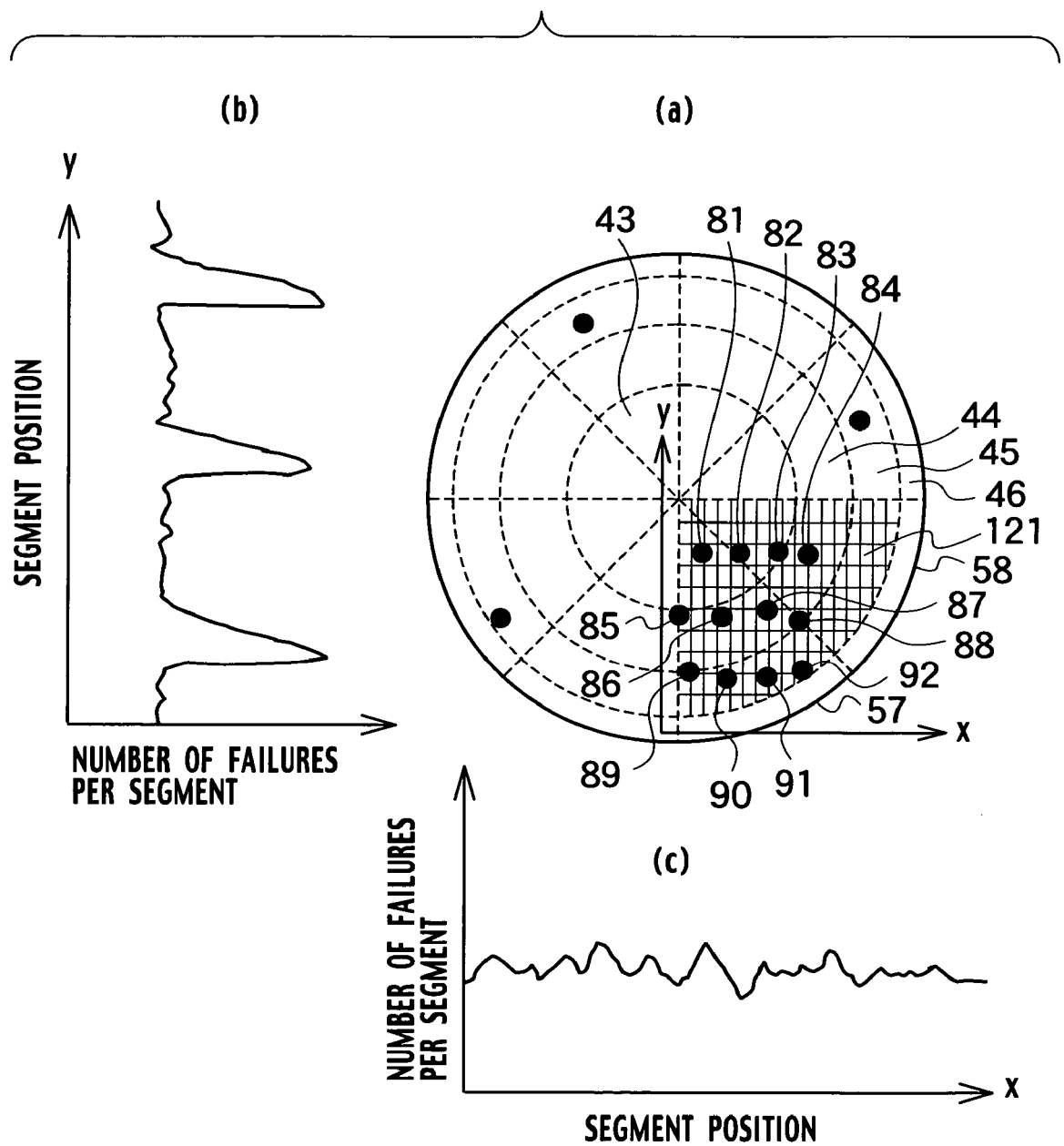
FIG. 14 is a diagram showing the number of failures per segment for each x value and each y value, respectively, which are fundamental to the feature amounts representing exposure-caused failure of Example 1.

In addition, as shown in FIG. 14, the section in the wafer in FIG. 6, which is the logical product of sections 43 through 45 and sections 57 and 58 is divided into minute segments 121, each having a size matching the exposure cycle period. The directions of the exposure cycle periods are set to x and y axes, respectively. More specifically, as shown in FIG. 14(b), a projection profile $q_j$ of the number of failure bits on the y axis is calculated. In addition, as shown in FIG. 14(c), a projection profile $p_j$ of the number of failure bits on the x axis is calculated; where j denotes a segment number.

Figure 15A:
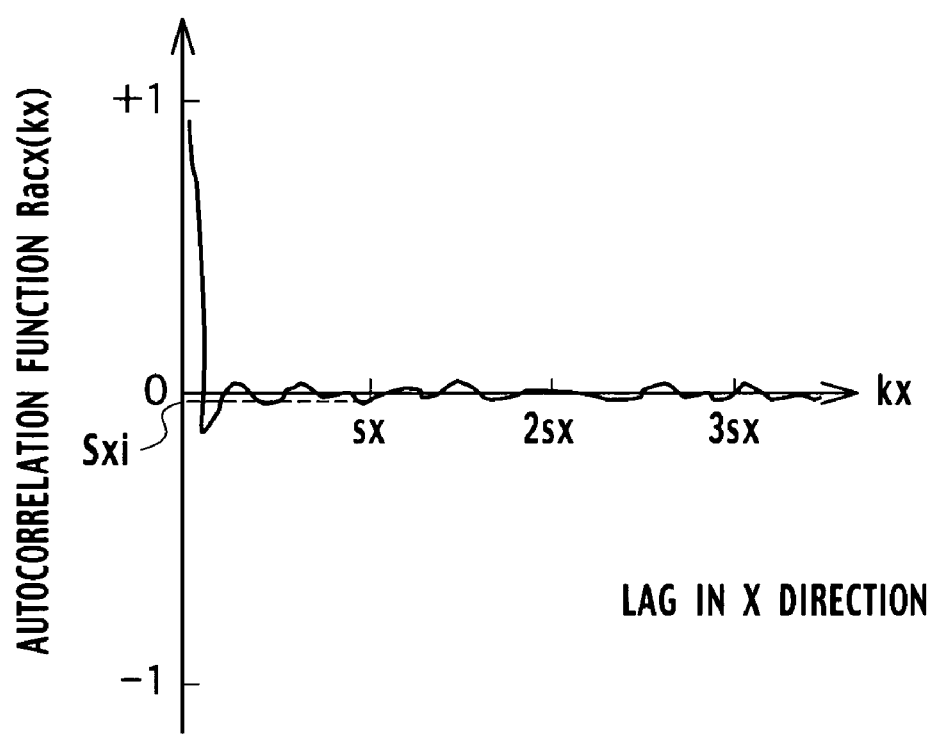
FIG. 15A is a graph showing autocorrelation function of x, which is a feature amount that represents exposure-caused failure of Example 1.
Figure 15B:
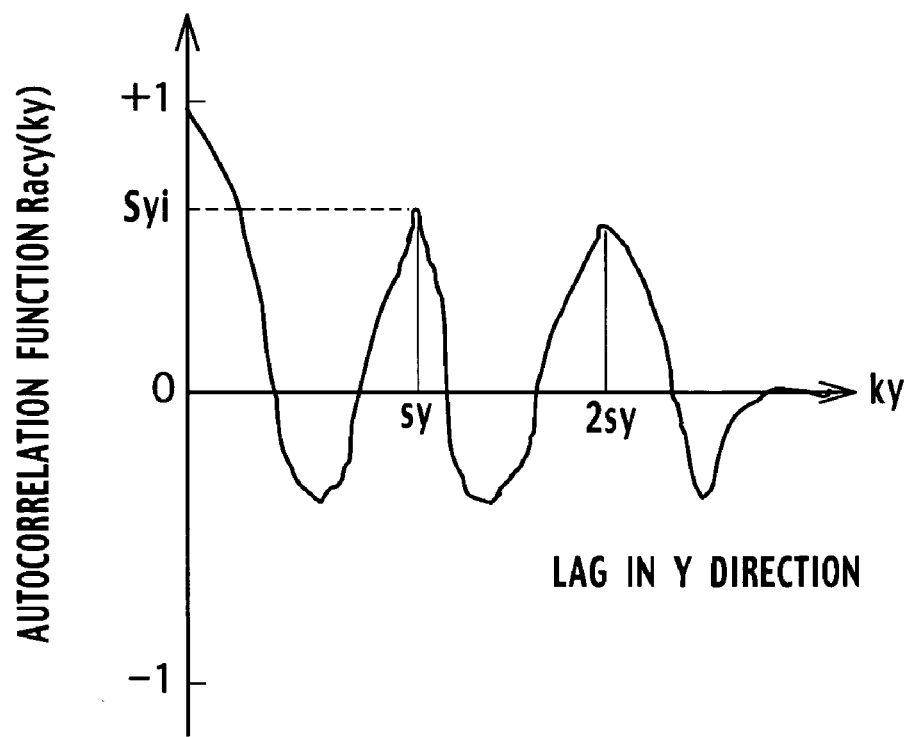
FIG. 15B is a graph showing autocorrelation function of y, which is a feature amount that represents exposure-caused failure of Example 1.

Next, as shown in FIGS. 15A and 15B, the autocorrelation functions Racx and Racy for the projection profiles $p_j$ and $q_j$ are calculated, respectively. The autocorrelation function Racx is calculated using Expressions (2) through (4) by shifting the projection profile $p_j$ by a lag kx, which equals the exposure cycle period, and then finding correlation of the projection profile $p_j$ with the shifted projection profile; in the same manner, the autocorrelation function Racy is calculated using the same expressions by shifting the projection profile $q_j$ by a lag ky, which equals the exposure cycle period, and then finding correlation of the projection profile $q_j$ with that shifted projection profile.

$$\mu = \frac{1}{N} \sum_{j=1}^{N} p_j \qquad (2)$$

$$C(k_x) = \frac{1}{N} \sum_{j=k_x+1}^{N} (p_j - \mu)(p_{j-k_x} - \mu) \qquad (3)$$

$$Racx(k_x) = \frac{C(k_x)}{C(0)} \qquad (4)$$

Calculation for the y axis is performed in the same manner using Expressions (2) through (4).

If there are exposure-caused failures, the projection profiles $p_j$ and $q_j$ have a periodicity that equals the exposure cycle period. The autocorrelation function Racx becomes a local maximum value when the projection profile $p_j$ is shifted by the lag corresponding to the exposure cycle period; in the same manner, the autocorrelation function Racy becomes a local maximum value when the projection profile $q_j$ is shifted by the lag corresponding to the exposure cycle period. As shown in FIGS. 15A and 15B, sx and sy denote the exposure cycle periods converted by a corresponding number of segments, respectively, and Racx(sx) and Racy(sy) denote the feature amount components Sxi and Syi that represent exposure-caused failures in each section, respectively; where i denotes a section number. Note that this calculation is also performed for each wafer test and for each wafer. The feature amount components Sxi and Syi are then added to the waveforms in FIGS. 12A through 12D for each wafer, configuring the generalized feature amounts g. In other words, a set of feature amount components Sxi and Syi for each wafer, which represent a failure bit existing rate fi and an exposure-caused failure for each section obtained by each wafer test, is called the generalized feature amount g. Hereafter, gi denotes the elements of the generalized feature amounts g, and are called generalized feature amounts. The suffix i of an element gi in the generalized feature amounts g can take number up to Ng, which is shared by a failure bit existing rate fi and feature amount components Sxi and Syi that represent exposure-caused failures, and is capable of being counted up or down.

Figure 16A:
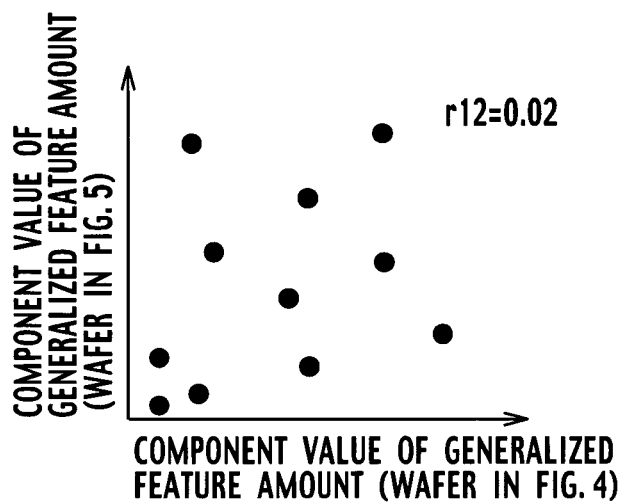
FIG. 16A is a graph showing correlation between the wafers of FIGS. 4 and 5 of Example 1.
Figure 16B:
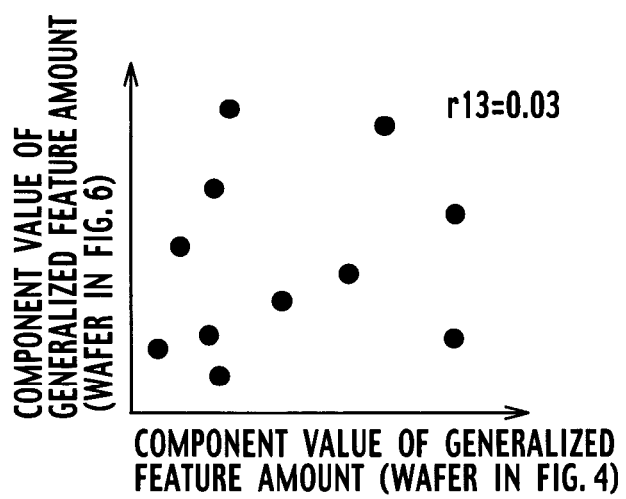
FIG. 16B is a graph showing correlation between the wafers of FIGS. 4 and 6 of Example 1.
Figure 16C:
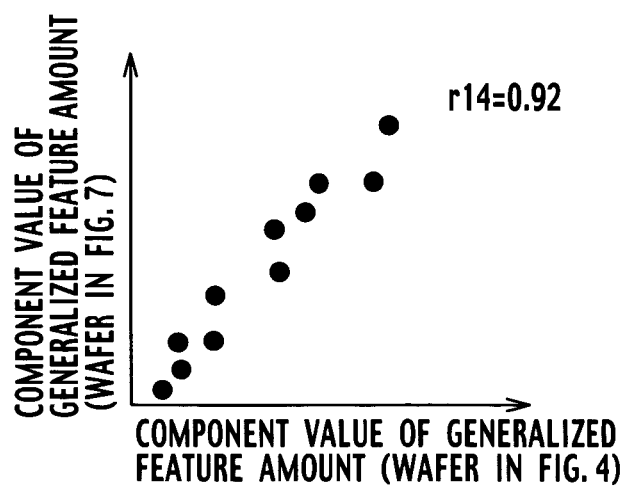
FIG. 16C is a graph showing correlation between the wafers of FIGS. 4 and 7 of Example 1.

Next, execution of steps S4 through S6 is omitted. In step S7, the inter-wafer correlation coefficient calculation unit 12 calculates the correlation coefficient Y among all target wafers in terms of the generalized feature amounts g. As shown in FIGS. 16A through 16C, inter-wafer correlation can be found from the scatter diagrams in which the generalized feature amounts g for differing wafers are plotted. In FIG. 16A, there is no correlation between the components gi of the generalized feature amounts g for the wafers in FIGS. 4 and 5. In addition, in FIG. 16B, there is no correlation between the components gi of the generalized feature amounts g for the wafers in FIGS. 4 and 6. On the other hand, in FIG. 16C, there are strong correlations between the components gi of the generalized feature amounts g for the wafers in FIGS. 4 and 7. In order to quantify those correlations, the correlation coefficients rij between wafers i and j in terms of the generalized feature amounts g are found using Expressions (5) through (8).

$$r_{ij} = \frac{Cov(i,j)}{\sigma_i \sigma_j} \quad (5)$$

$$Cov(i,j) = \frac{1}{N_g} \sum_k (g_k - \mu_g)(h_k - \mu_h) \quad (6)$$

$$\sigma_i = \sqrt{\left(\frac{1}{N_g} \sum_k g_k^2\right) - \mu_g^2} \quad (7)$$

$$\sigma_i = \sqrt{\left(\frac{1}{N_g} \sum_k h_k^2\right) - \mu_h^2} \quad (8)$$

where, gk and hk denote the components of the generalized feature amounts for the wafers i and j, respectively.

Figure 5:
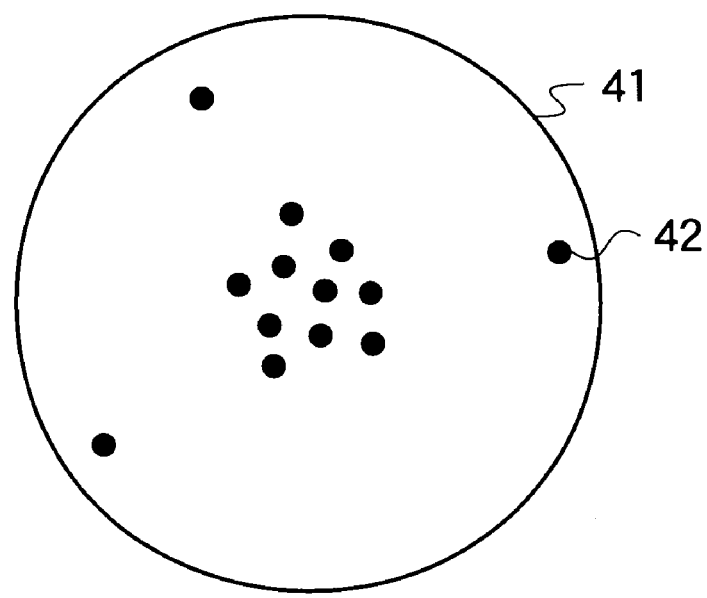

As a result, the correlation coefficient r12 between wafers w1 and w2 in FIGS. 4 and 5 is 0.02. The correlation coefficient r13 between wafers w1 and w3 in FIGS. 4 and 6 is 0.03. The correlation coefficient r14 between wafers w1 and w4 in FIGS. 4 and 7 is 0.92.

Figure 17:
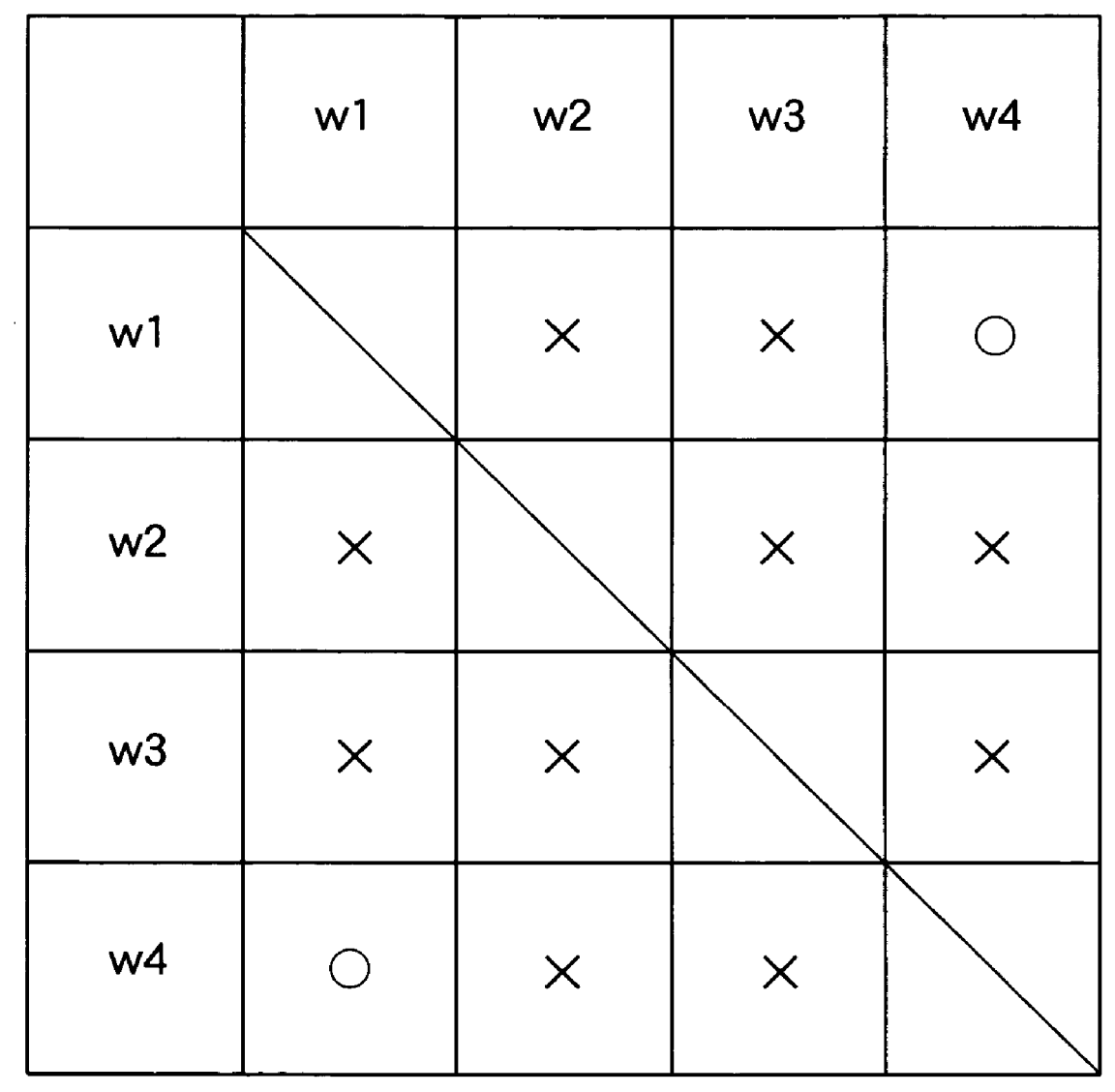

In step S8, the similar wafer detection unit 13 sets the threshold to 0.8. If the correlation coefficient rij is greater than the threshold of 0.8, it is determined that those wafers i and j have similar failure distributions. As shown in FIG. 17, the correlation coefficients rij that are greater than the threshold of 0.8 are r14 and r41. Other correlation coefficients rij are less than the threshold of 0.8.

Conventionally, usage of only a specific failure distribution is allowed and a feature amount calculation algorithm dedicated thereto must be individually defined. On the other hand, in Example 1, the similarity of failure distribution among wafers can be quantified using the correlation functions rij in terms of the generalized feature amounts g regardless of the type of failure distribution. In addition, wafers with similar failure distributions can be automatically detected.

In the latter half of this Example 1, wafers with similar failure distributions are grouped according to similarity in failure distribution among the wafers, which is determined using the generalized feature amounts g, and failure categories are automatically generated.

Conventionally, failure categories have been generated by a human conducting visual inspection of the FBM and finding failure distributions that frequently occur. Automation of failure category generation allows configuration of a system that automatically outputs a report of problematic failures occurring at a manufacturing plant for semiconductor devices.

Sets of wafers, each having similar failure distributions, are generated from all wafers manufactured at a plant within a certain fixed period, such as one day or one week, based on the quantified similarity in failure distribution between two wafers.

To begin with, in step S9, the similar wafer group generation unit 14 generates similar wafer groups S, each having similar failure distributions. The similar wafer groups S are generated by identifying another wafer that is similar to each wafer.

For example, regarding wafer w1 in FIG. 17, a wafer similar to wafer w1 is the wafer w4. Consequently, a similar wafer group S1 configured with two wafers w1 and w4 is generated as shown in FIG. 18. Regarding wafer w2, there is no wafer that is similar to wafer w2. Consequently, a similar wafer group S2 configured with only a single wafer w2 is generated. Similarly, regarding wafer w3, there is no wafer that is similar to wafer w3. Consequently, a similar wafer group S3 configured with only a single wafer w3 is generated. Regarding wafer w4, the wafer similar to wafer w1 is wafer w4. Consequently, a similar wafer group S4 configured with two wafers w4 and w1 is generated.

In step S10, the similarity calculation unit 15 calculates the similarity Rij between the similar wafer groups Si and Sj. The similarity Rij is defined by the rate of wafers in the similar wafer groups Si and Sj correlating with each other. In other words, the similarity Rij is defined as the ratio of the number of paired wafers correlating with each other to the total number of paired wafers belonging to the similar wafer groups Si and Sj. The threshold for the similarity Rij is set to 0.5. It is determined that the similar wafer groups Si and Sj, having similarity Rij which is equal to or greater than the threshold of 0.5, are similar to each other. Note that the similarity Rij may be defined as the ratio of the number of wafers belonging to both the similar wafer groups Si and Sj to the number of wafers belonging to at least either the similar wafer group Si or Sj.

For example, the similarity R14 between the similar wafer groups S1 and S4 is the ratio of paired wafers (w1 and w4) correlated with each other to paired wafers (w1 and w4) belonging to the similar wafer groups S1 and S4, which is 1/1 or 1.0. As shown in FIG. 18, since the similarity R14 is 1.0, which is greater than the threshold of 0.5, it is determined that the similar wafer groups S1 and S4 are similar to each other. Similarly, since the similarity R41 is 1.0, which is greater than the threshold of 0.5, it is determined that the similar wafer groups S4 and S1 are similar to each other.

The similarity R12 between the similar wafer groups S1 and S2 is 0/1 or zero because there is no paired wafer correlating with each other against the paired wafers (w1 and w4) belonging to the similar wafer groups S1 and S4. Since the similarity R12 is zero, which is less than the threshold of 0.5, it is determined that the similar wafer groups S1 and S2 are not similar to each other. Similarly, since the similarity R21 is zero, which is less than the threshold of 0.5, it is determined that the similar wafer groups S2 and S1 are not similar to each other. Similarly, the similarities R13, R31, R42, R24, R43, R34, R23, and R32 are zero. Since each of the similarities R13, R31, R42, R24, R43, R34, R23, and R32 is less than the threshold of 0.5, it is determined that the paired similar wafer groups (S1 and S3), (S3 and S1), (S4 and S2), (S2 and S4), (S4 and S3), (S3 and S4), (S2 and S3), and (S3 and S2) are not similar.

Next, in step S11, as shown in FIG. 18, the sorting unit 16 sorts the similar wafer groups Si in decreasing order of the number of elements or the number of wafers. The similar wafer groups S1 and S4, each including two wafers, are determined as first and second groups, respectively. The similar wafer groups S2 and S3, each including a single wafer, are determined as third and fourth groups, respectively.

In step S12, the failure category generation unit 17 groups the similar wafer groups in decreasing order of sorted ranking of each similar wafer group, while referencing the determination of similarity based on similarity Rij. To begin with, the similar wafer group S4 determined to be similar to the similar wafer group S1 with the highest sorted ranking is grouped together therewith. A failure category C1 is assigned as an identifier to these similar wafer groups S1 and S4.

The highest ranking of the similar wafer group Si excluding the similar wafer group S1 and the similar wafer groups Si grouped in that similar wafer group S1 is the similar wafer group S2. Regarding the similar wafer group S2, there is no similar wafer group Si not assigned with the failure category C1 and determined as being similar to that similar wafer group S2. Therefore, the similar wafer group S2 alone configures a group, and a failure category C2 is assigned as an identifier to that similar wafer group S2. In the similar wafer groups Si not grouped yet, the highest ranked similar wafer group Si is the similar wafer group S3. Regarding the similar wafer group S3, there is no similar wafer group Si not assigned with the failure category C1 or C2 and determined as being similar to that similar wafer group S3. Therefore, the similar wafer group S3 alone configures a group, and a failure category C3 is assigned as an identifier to that similar wafer group S3. This grouping is effective since there are many cases where the upper ranked similar wafer groups Si include almost the same wafers as elements.

In step S13, the failure category determination unit 18 groups the similar wafer groups Si, and then makes the sets of wafers except for shared wafers among each failure category C assigned group belong to the failure categories C1, C2, C3. The rate of the number of wafers correlating with one another in terms of the generalized feature amounts g to number of wafers belonging to the failure categories C1, C2, or C3, is found for each wafer. If this rate is equal to or greater than a predetermined threshold, each wafer is determined to belong to a corresponding failure category C. As a result, failure categories C to which each wafer belongs are determined. Accordingly, a single wafer may belong to multiple categories C.

Specifically, the threshold is set to 0.4. Wafer w1 correlates with a single wafer w4 in terms of the failure category C1. Since the failure category C1 includes two wafers w1 and w4, the rate of the number of wafers is ½ or 0.5. Since this rate of wafer w1 of 0.5 is larger than the threshold of 0.4, wafer w1 belongs to the failure category C1. On the other hand, wafer w1 does not correlate with other wafers in terms of the failure categories C2 and C3. Therefore, the rate of the number of wafers is zero. Since this zero rate of wafer w1 is smaller than the threshold of 0.4, wafer w1 does not belong to the failure categories C2 and C3.

Wafer w4 correlates with a single wafer w1 in terms of the failure category C1. Since the failure category C1 includes two wafers w1 and w4, the rate of the number of wafers is ½ or 0.5. Since this rate of wafer w4 of 0.5 is larger than the threshold of 0.4, wafer w4 belongs to the failure category C1. On the other hand, wafer w4 does not correlate with other wafers in terms of the failure categories C2 and C3. Therefore, the rate of the number of wafers is zero. Since this zero rate of wafer w4 is smaller than the threshold of 0.4, wafer w4 does not belong to the failure categories C2 and C3.

In step S14, the representative wafer determination unit 19 determines as a representative wafer, one of the wafers belonging to each failure category C and correlates with the largest number of wafers in terms of the generalized feature amounts g, For example, of the wafers w1 and w4 in the failure category C1, wafers w1 and w4 correlating to each other are determined to be representative wafers.

In step S15, the representative wafer group determination unit 20 includes in a failure category representative wafer groups a wafer correlating with the representative wafer in the failure categories C in terms of the generalized feature amounts g. For example, wafers w1 and w4 correlating with the representative wafers w1 and w4 in the failure category C1 are determined as a representative wafer group.

In step S16, the common device identification unit 21 identifies a manufacturing step and a manufacturing device commonly used to manufacture wafers belonging to the same failure category C from a process history stored in the process history storage unit 36. For example, the manufacturing step and the manufacturing device commonly used to manufacture wafers w1 and w4 belonging to the failure category C1 are identified.

Figure 19:
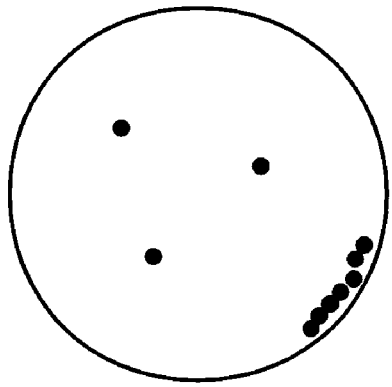
FIG. 19 is a table showing the failure categories, the number of wafers belonging to the failure categories, and representative wafers in the respective failure categories of Example 1.
Figure 19:
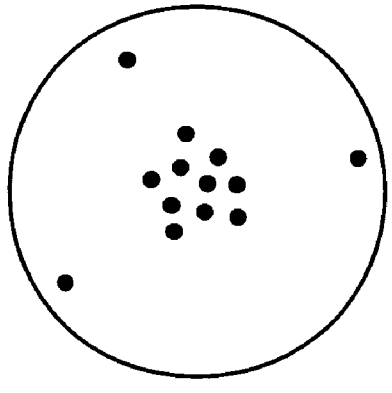
Figure 19:
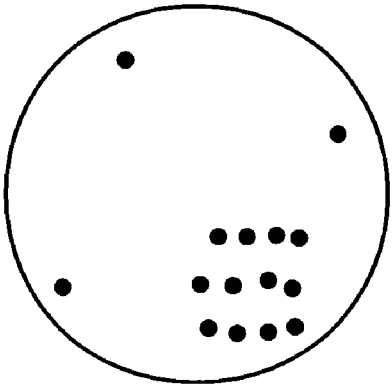

Finally, in step S17, the failure categories C generation result is reported from the input/output unit 22 to the report storage unit 38. As shown in FIG. 19, the reported content includes the number of wafers and failure distribution in the representative wafer or the representative wafer group, which are shown in decreasing order of the number of wafers.

As mentioned above, in Example 1, the similar failure distribution is highly accurately identified, and the failure categories C are automatically generated from failure information regardless of the failure distribution patterns. These failure categories allow immediate identification of a clustering distribution of failures based on the representative wafer failure distribution. In addition, a manufacturing step and a manufacturing device at a wafer manufacturing plant that cause a clustering distribution of failures to occur can be identified quickly. This allows enhancement of the wafer yield.

As described above, according to the failure analysis method of Example 1, failure distribution developed in each wafer can be automatically classified for each wafer. According to the failure analyzer of Example 1, failure distribution developed in each wafer can be automatically classified for each wafer.

EXAMPLE 2

In Example 2, the failure categories C, which are sets of wafers, each having similar failure distributions, are generated from all of the wafers manufactured at a plant within a certain period such as one day or one week. Example 2 also employs the wafer failure analyzer 2 in FIG. 1 and conforms to the flowchart of FIG. 2.

To begin with, in step S1, a target wafer ID to be subjected to failure analysis is input. In Example 2, wafers to be manufactured at a plant within one day are subjected to failure analysis.

In the following, steps S2 through S9 are the same as those in Example 1.

In step S10, the similarity Rij between the similar wafer groups Si and Sj is calculated. The threshold for the similarity Rij is set to 0.5. It is determined that the similar wafer groups Si and Sj with a greater similarity Rij than the threshold of 0.5 are similar to each other.

For example, as shown in FIG. 20, the similarity R106 between the similar wafer groups S10 and S6 is greater than the threshold of 0.5, and thus they are marked with a symbol, such as a circle, and determined to be similar to each other. Since the similarity R102 between the similar wafer groups S10 and S2 is less than the threshold, they are marked with a symbol, such as 'x', and determined not to be similar dissimilar to each other. Similarly, since the similarity R108 between the similar wafer groups S10 and S8 is greater than the threshold, they are marked with a symbol of a circle and determined to be similar to each other. Since the similarity R109 between the similar wafer groups S10 and S9 is less than the threshold, they are marked with a symbol, such as 'x', and determined not to be similar dissimilar to each other. Since the similarity R103 between the similar wafer groups S10 and S3 is less than the threshold, they are marked with a symbol, such as 'x', and determined not to be similar dissimilar to each other. Since the similarity R62 between the similar wafer groups S6 and S2 is less than the threshold, they are marked with a symbol, such as 'x', and determined not to be similar dissimilar to each other. Since the similarity R68 between the similar wafer groups S6 and S8 is greater than the threshold, they are marked with a symbol, such as a circle, and determined to be similar to each other. Since the similarity R69 between the similar wafer groups S6 and S9 is less than the threshold, they are marked with a symbol, such as 'x' and determined not to be similar dissimilar to each other. Since the similarity R63 between the similar wafer groups S6 and S3 is less than the threshold, they are marked with a symbol, such as 'x' and determined not to be similar dissimilar to each other. Since the similarity R28 between the similar wafer groups S2 and S8 is greater than the threshold, they are marked with a symbol, such as a circle, and determined to be similar to each other. Since the similarity R29 between the similar wafer groups S2 and S9 is less than the threshold, they are marked with a symbol, such as 'x', and determined not to be similar dissimilar to each other. Since the similarity R23 between the similar wafer groups S2 and S3 is greater than the threshold, they are marked with a symbol of a circle and determined to be similar to each other. Since the similarity R89 between the similar wafer groups S8 and S9 is less than the threshold, they are marked with a symbol of 'x' and determined not to be similar to each other. Since the similarity R83 between the similar wafer groups S8 and S3 is greater than the threshold, they are marked with a symbol of a circle and determined to be similar to each other. Since the similarity R93 between the similar wafer groups S9 and S3 is less than the threshold, they are marked with a symbol of 'x' and determined not to be similar to each other.

Next, in step S11, the similar wafer groups Si are sorted in decreasing order of the number of wafers belonging to the groups or in the order of S10, S6, S2, S8, S9, and S3, as shown in FIG. 20.

In step S12, the similar wafer groups Si that are similar to the similar wafer group S10 are grouped in decreasing order of the sorted ranking from the similar wafer group S10, while referencing the similarity and the dissimilarity indicated by a symbol of a circle or a symbol of 'x', respectively. Regarding the similar wafer group S10, the similar wafer groups S6 and S8 those are similar to the similar wafer group S10 are grouped. A failure category C1 is assigned to these similar wafer groups S10, S6, and S8 as an identifier.

Of the similar wafer groups Si not grouped together with the similar wafer group S10, the similar wafer group S2 includes the greatest number of wafers. The similar wafer group S3, which is similar to the similar wafer group S2 in the similar wafer groups Si not grouped in the similar wafer group S10, is grouped together with the similar wafer group S2. A failure category C2 is assigned to these similar wafer groups S2 and S3 as an identifier. Since the similar wafer group S8 is similar to the similar wafer groups S2 and S10, and the similar wafer group S10 has a greater number of wafers, the similar wafer group S8 is grouped together with the similar wafer group S10. This grouping is effective since there are many cases where almost all of the wafers are shared among the upper ranked similar wafer groups Si.

Except for the similar wafer groups Si that have already been grouped, the highest ranked similar wafer group Si is the similar wafer group S9. There is no similar wafer group Si similar to the similar wafer group S9 except for the similar wafer groups that have already been grouped. Therefore, the similar wafer group S9 alone configures a group, and a failure category C3 is assigned to the similar wafer group S9 as an identifier.

In step S13, similar wafers are grouped together, and the sets of wafers resulting from excluding shared wafers among each group are then determined as failure categories C1, C2, C3, respectively. The rate of the number of wafers correlating to each other in terms of the generalized feature amounts g to number of wafers belonging to the respective failure categories C1, C2, or C3, is found for each wafer. If this rate is greater than a predetermined threshold, the respective wafers belong to one of the corresponding failure categories C.

In step S14, a wafer correlating with the largest number of other wafers in terms of the generalized feature amounts g is selected from the wafers in each of the failure categories C and determined as a representative wafer.

In step S15, the wafer correlating with the representative wafer in each failure category C in terms of the generalized feature amounts g is determined to form a representative wafer group.

In step S16, a manufacturing process and a manufacturing device commonly used to manufacture wafers belonging to the same failure category C are identified from a process history stored in the process history storage unit 36.

Figure 21:
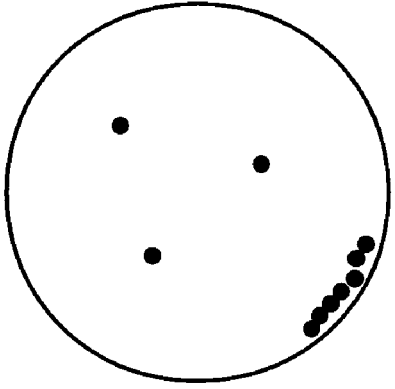
FIG. 21 is a table showing the failure categories, the number of wafers belonging to the failure categories, and the representative wafers in the respective failure categories of Example 2.
Figure 21:
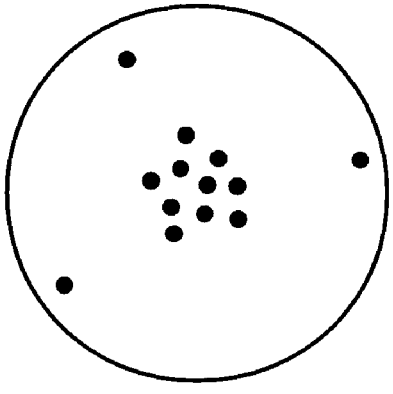
Figure 21:
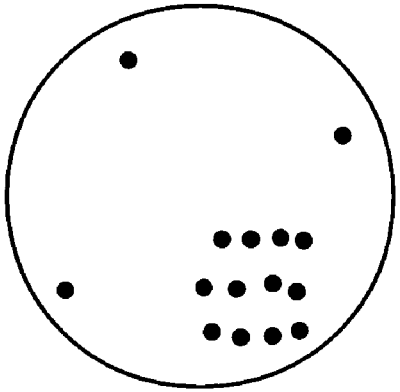

Finally, in step S17, the failure categories C generation result is output as a report. As shown in FIG. 21, the reported content includes the number of wafers and failure distribution in the representative wafer or the representative wafer group in decreasing order of the number of wafers belonging thereto.

As mentioned above, in example 2, a similar failure distribution is identified very accurately, and the failure categories C are automatically generated from failure information of a lot of wafers tested at a plant within one day regardless of failure distribution patterns. This failure category allows identification of failures with clustering distribution based on the representative wafer failure distribution. In addition, a manufacturing step and a manufacturing device at a wafer manufacturing plant that cause failures with clustering distribution to occur can be immediately identified. This allows enhancement of the wafer yield.

As described above, according to the failure analysis method of Example 2, failure distribution developed in each wafer can be automatically classified in units of wafer and also in units of lot. According to the failure analyzer of Example 2, failure distribution developed in each wafer can be automatically classified in units of wafer and also in units of lot.

EXAMPLE 3

In Example 3, the sections for calculating the generalized feature amounts g in step S3 of FIG. 2 are moved, expanded, and/or contracted. This allows improved accuracy in detection of wafers with similar failure distributions.

Figure 22:
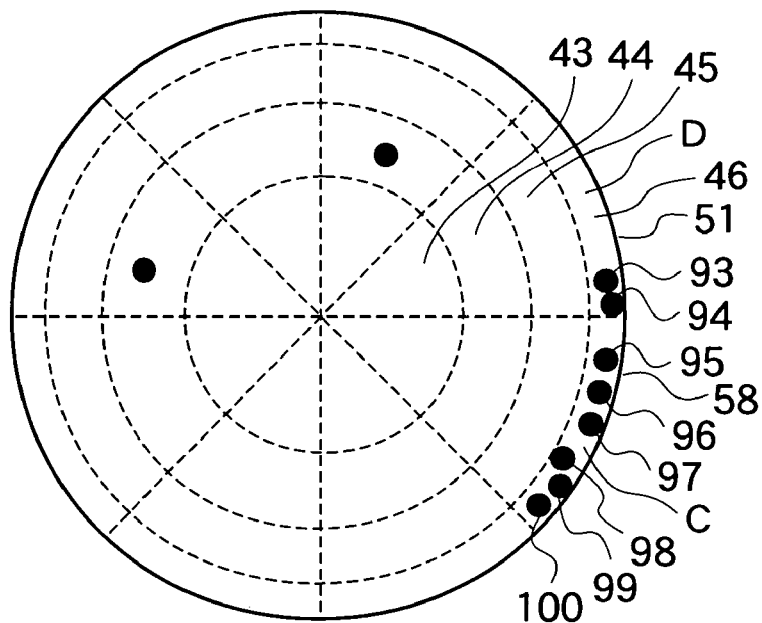
FIGS. 22 and 23 are diagrams showing wafer failure distribution of Example 3.
Figure 23:
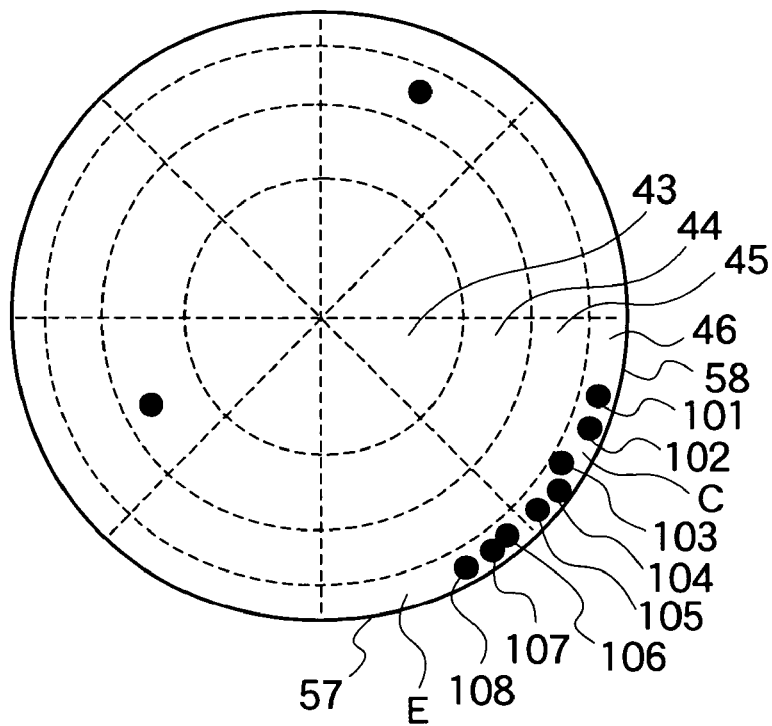

As shown in FIGS. 22 and 23, failure distributions in two wafers are extraordinarily similar to each other in that failures tend to gather at the outer regions of the wafers. It is thought that the cause of failures in those wafers in FIGS. 22 and 23 may be the same; therefore, it should be determined that those wafer failure distributions are similar to each other. However, from detailed examination based on step S3 in FIG. 2, it can be seen that the wafer in FIG. 22 has failures with clustering distribution gathering at the outer region of the wafer, in particular, in section C, and part of the failures exist in section D. In the wafer of FIG. 23, clustering failures grouped at the outer region of the wafer exist in sections C and E. The correlation coefficient r with respect to the generalized feature amounts g between those wafers is 0.76. Since the correlation coefficient r is less than the threshold of 0.8, it is determined that the wafer failure distributions in FIGS. 22 and 23 are not similar to each other.

This is because the sections are defined systematically, and failures crossing the boundary between those sections even slightly may considerably affect the generalized feature amounts g depending on the failure distribution pattern near that boundary line.

Therefore, all sections are moved, expanded, and/or flexibly contracted. More specifically, section C is moved, expanded and/or contracted within a certain range that allows the ratio of the overlapped area between section C and the adjacent sections to the original area of section C to be less than a fixed value. Regarding section C capable of being moved, expanded, and/or contracted, the area of section C that allows a failure existing rate f to be the greatest when moving, expanding, and/or contracting that section C is determined as a defined area for section C.

Figure 24:
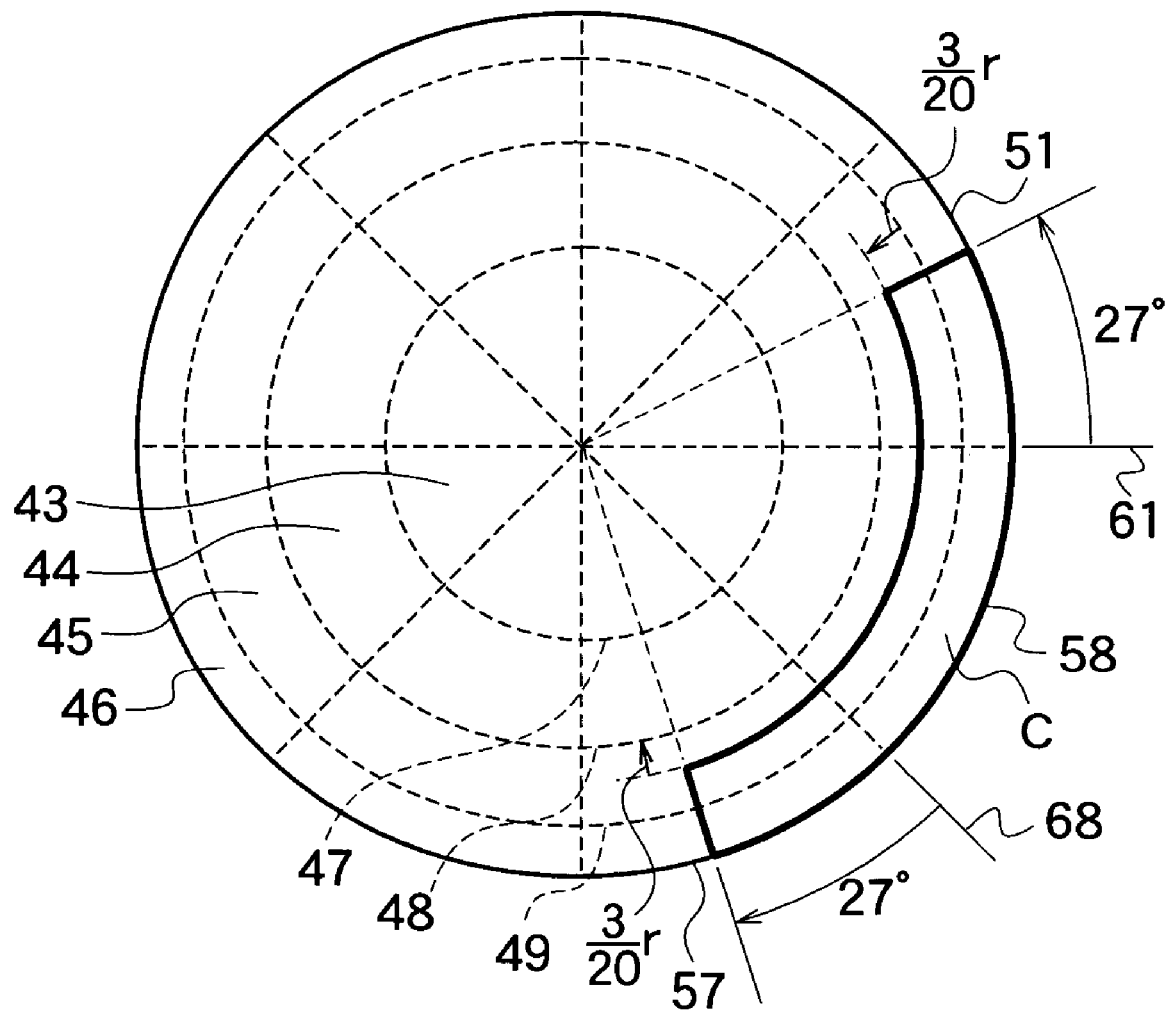
FIG. 24 is a diagram showing sections of Example 3.

Movement, expansion, and/or contraction of sections may be carried out along the radius and/or with respect to the center angle of the wafer. The ratio that designates the range of movement, expansion, and contraction is set to 60%. As shown in FIG. 24, section C can be widened by 60% along the radius of the wafer. In addition, section C can be widened by 60% or a 27-degree angle with respect to the center angle of the wafer.

Figure 25:
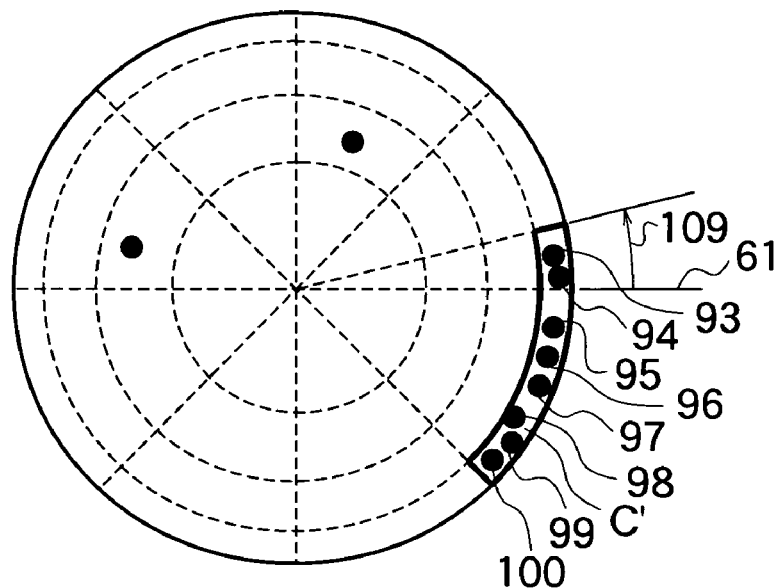
FIG. 25 is a diagram showing sections corresponding to the wafer failure distribution of FIG. 22.
Figure 26:
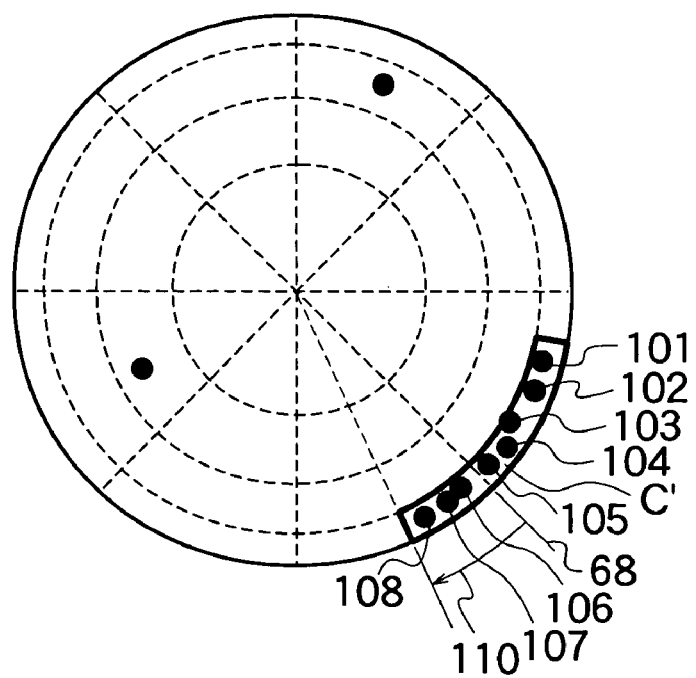
FIG. 26 is a diagram showing sections corresponding to the wafer failure distribution of FIG. 23.

As shown in FIG. 25, section C is expanded to the range including an additional 109-degree angle in the case of the failure distribution of FIG. 22. As shown in FIG. 26, section C is moved to the next section up to the range including an additional 110-degree angle in the case of the failure distribution of FIG. 23. According to the movement and expansion of this section, the correlation coefficient r between the wafers in terms of the generalized feature amounts g is 0.92. Since the correlation coefficient r is larger than the threshold of 0.8, it is determined that the failure distributions in the wafers of FIGS. 22 and 23 are similar to each other.

Note that when general feature amounts g corresponding to the case where the smaller the value, the more failures exist are used, the sections should be moved, expanded, and/or contracted so that the generalized feature amounts g can be the local minimum values.

As described above, flexible movement, expansion, and/or contraction of the sections allows reduction in the number of false determinations of similarity between failure clustering distributions.

As mentioned above, according to the failure analysis method of Example 3, failure distributions in each wafer can be automatically classified in units of wafer and even in units of lot. According to the failure analyzer of Example 3, failure distributions in each wafer can be automatically classified in units of wafer and even in units of lots.

EXAMPLE 4

With Example 4, in steps S5 and S6 in FIG. 2, wafers with similar failure distributions are identified using the generalized feature amounts g defined in Example 1. For this identification, the alignment of the components in the generalized feature amounts g is taken into account.

The use of steps S5 and S6 allows omission of steps S7 and S8 of Example 1. In this case, similarity between wafers can be determined whether or not both of the autocorrelation coefficients are large and the difference between the autocorrelation coefficients is equal to or less than a fixed value. In short, if wafer failure distributions are similar to each other, the difference between the autocorrelation coefficients for each wafer is small. On the other hand, if wafer failure distributions are not similar to each other, the difference between the autocorrelation coefficients for each wafer is large.

Regarding the generalized feature amounts g as a waveform, each waveform differs depending on the alignment order of the components in the generalized feature amounts g. Positioning relevant components next to one another allows formation of a waveform with regularity. Which components are relevant to one another depends on the failure distribution patterns.

Figure 27:
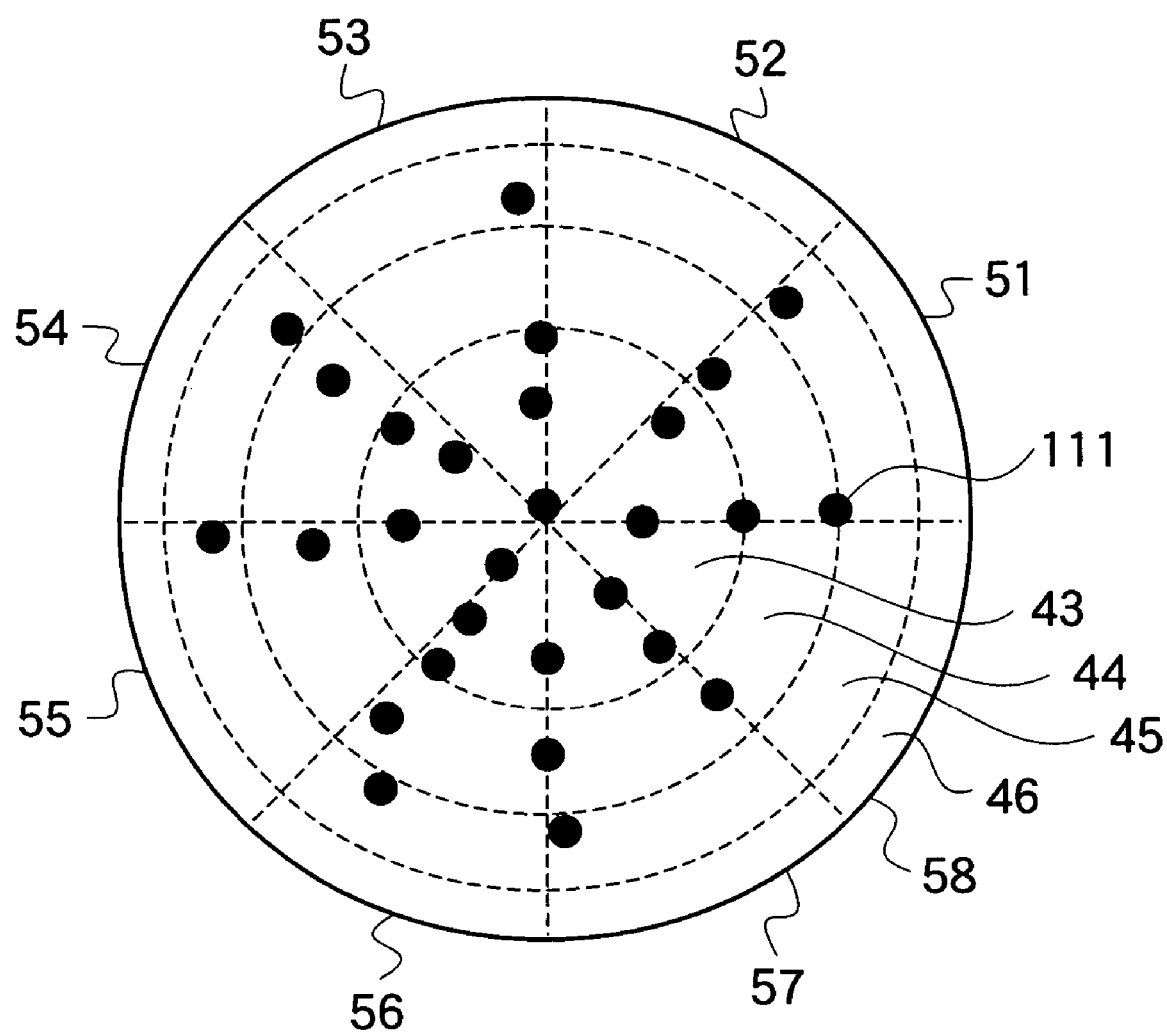
FIG. 27 is a diagram showing wafer failure distribution of Example 4.

For example, Example 4 is used for wafers with failures expending radially from the wafer center, as shown in FIG. 27.

Figure 28A:
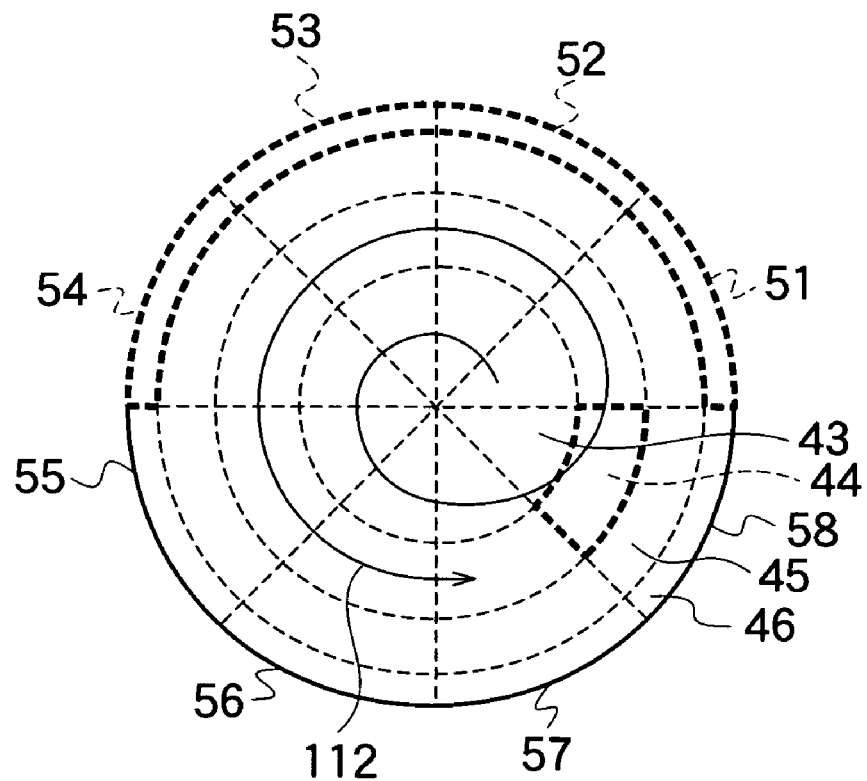
FIG. 28A is a diagram showing the spirally progressing order of selecting sections.
Figure 29A:
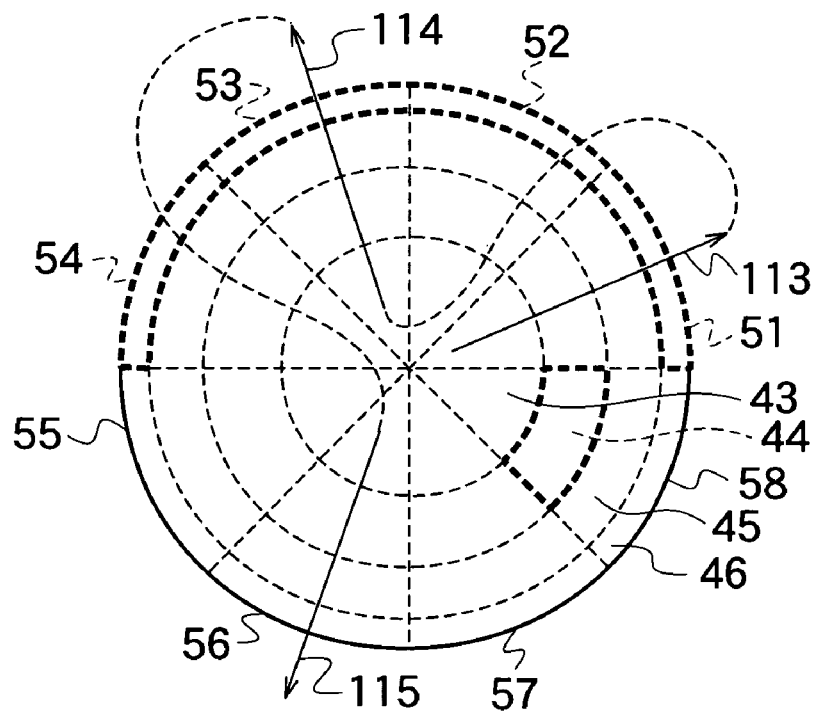
FIG. 29A is a diagram showing the order of selecting sections along the radius.

In step S5, the alignment unit 10 stores as the order library in the order library storage unit 37 in FIG. 1, a set of an alignment order 112, which indicates the order in which the generalized feature amounts g are spirally aligned counter-clockwise as shown in FIG. 28A, and a lag width to be used to calculate an autocorrelation coefficient. The lag width, which is an element of the set with the alignment order 112, is set based on the number of each component relevant to the respective sections 43 through 46. In addition, a set of an alignment order 113 through 115, which indicates the order in which the generalized feature amounts g are radially aligned as shown in FIG. 29A, and a lag width to be used to calculate the autocorrelation coefficients, is stored as an order library in the order library storage unit 37. The lag width, which is an element of the set with the alignment order 113 through 115, is set based on the number of each component relevant to the respective sections 51 through 58.

Figure 28B:
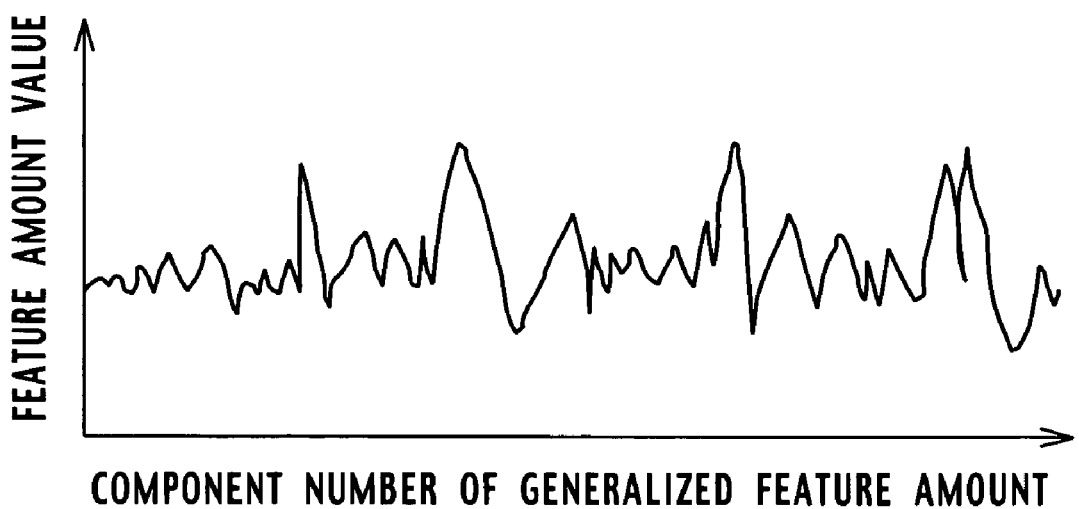
FIG. 28B is a waveform of the generalized feature amounts that are aligned based on the spirally progressing order of selecting the sections.

Regarding the alignment order shown in FIG. 28A, each component is aligned according that order so that a waveform as shown in FIG. 28B is formed. In step S6, the autocorrelation coefficient calculation unit 11 calculates an autocorrelation coefficient Rac for the formed waveform using Expressions (2) through (4) based on the lag width, which is an element of the set with the alignment order shown in FIG. 28A. Since the autocorrelation coefficient Rac is 0.03 or small, it is determined that there is no regularity in the waveform.

Figure 29B:
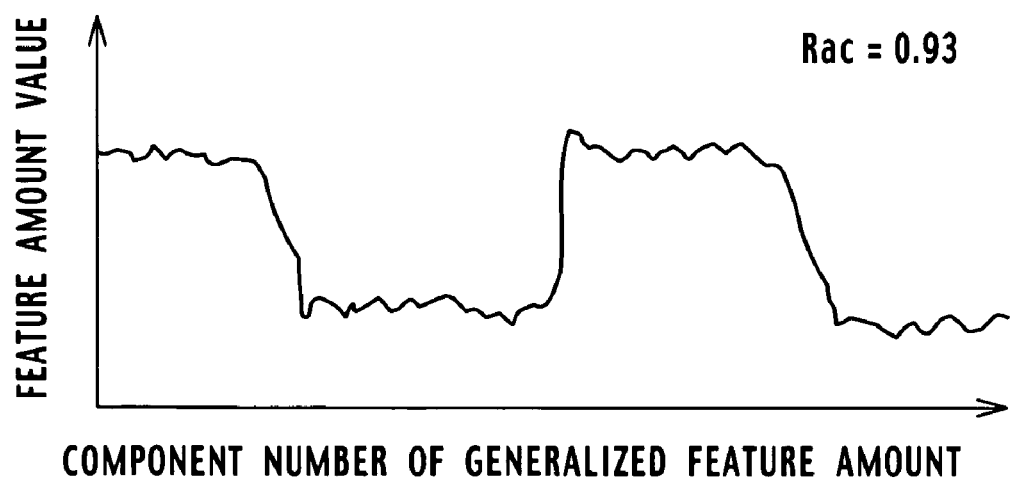
FIG. 29B is a waveform representing the generalized feature amounts that are aligned based on the order of selecting sections along the radius.

Regarding the other alignment order shown in FIG. 29A, each component is aligned according to that order so that a waveform shown in FIG. 29B is formed. In step S6, the autocorrelation coefficient Rac for the formed waveform is calculated based on the lag width, which is an element of the set with the alignment order shown in FIG. 29A, as well. Since the autocorrelation coefficient Rac is 0.93 or large, it is determined that there is regularity in the waveform. In this way, the regularity in each waveform can be quantified by the autocorrelation coefficient.

Figure 30A:
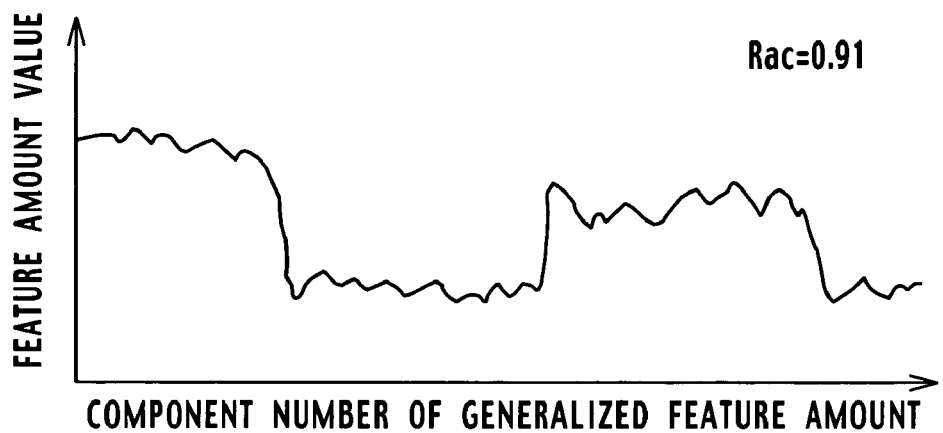
FIGS. 30A through 30C are waveforms representing generalized feature amounts that are aligned based on the spirally progressing order of selecting the sections for other wafer failure distributions.
Figure 30B:
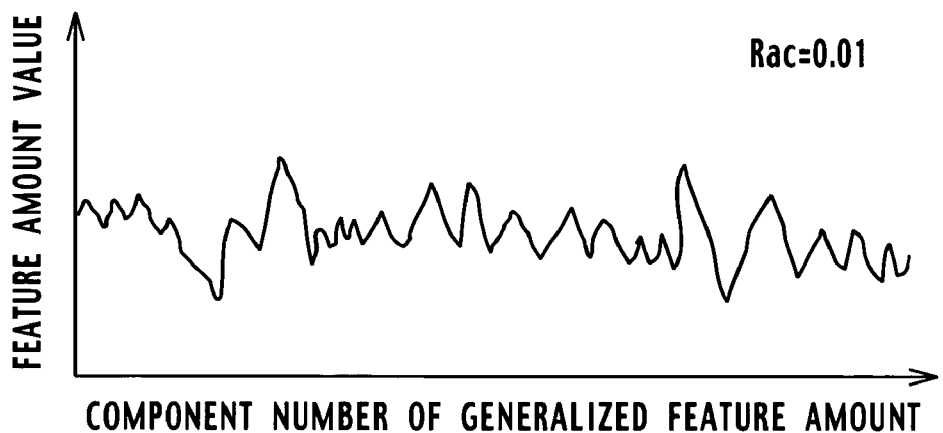
Figure 30C:
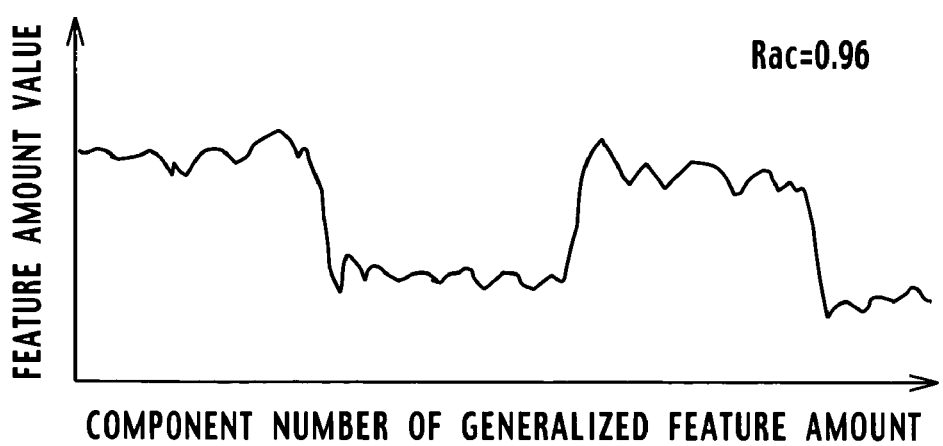

As shown in FIG. 30, from the waveforms formed when the alignment order shown in FIG. 29A is used for three other wafers, the waveforms of FIGS. 30A and 30C have similar regularity to the waveform of FIG. 29B, and the autocorrelation coefficients Rac are 0.91 and 0.96, each being greater than 0.9. On the other hand, the waveform of FIG. 30B is an irregular waveform, and the autocorrelation coefficient Rac is 0.01 or almost zero. As a result, it is determined that two wafers in FIGS. 30A and 30C have radial failure distributions as with that in FIG. 27. Alternatively, a threshold value of 0.9 for the autocorrelation coefficient Rac may be prepared in advance, which allows determination of multiple wafers with an autocorrelation coefficient Rac of 0.9 or greater to be similar to one another. Alternatively, threshold values of 0.8 and 0.1 for autocorrelation coefficients Rac and the difference between the autocorrelation coefficients Rac, respectively, may be prepared in advance, which allows determination of, of multiple wafers with an autocorrelation coefficient Rac being equal to 0.8 or greater, wafers with the difference between the autocorrelation coefficients Rac being equal to 0.1 or less to be similar to each other.

In this way, when the alignment order of the components in the generalized feature amounts g specific to a failure distribution is stored as an order library, and the components are then sorted according to the order library, if a waveform has regularity, the corresponding wafer is determined to have a failure distribution. As a result, wafers with a specific failure distribution can be detected.

As mentioned above, according to the failure analysis method of Example 4, the failure distribution developed in each wafer can be automatically classified in units of wafer and even in units of lot. According to the failure analyzer of Example 4, the failure distribution developed in each wafer can be automatically classified in units of wafer and even in units of lot.

EXAMPLE 5

In Example 5, the same step as step S4 in FIG. 2 is inserted after step S3 in Example 1. With Example 5, before failure categories C are generated using the generalized feature amounts g defined in Example 1, it is determined whether the wafer failure distribution is either a random distribution or a clustering distribution, and failure categories C are generated only for the wafers with failure clustering distribution, in the inserted step S4.

Failure classification, more specifically, classifying failures with clustering distribution, which may emanate from a manufacturing device, and then generating failure categories C is useful to identify the cause of failures. Failures with random distribution or without clustering distribution may interrupt generation of failure categories C for failures with clustering distribution. Therefore, it is desirable that wafers with random failure distribution be excluded from the target wafers prior to generation of the failure categories.

A method of distinguishing failures with random distribution from failures with clustering distribution by comparing the weights of a Poisson distribution as frequency distribution and negative binominal distribution has been suggested (K. Mitsutake, Y. Ushiku, Y. Arakawa, T. Ishibumi, and O. Ito, 'NEW METHOD OF EXTRACTION OF SYSTEMATIC FAILURE COMPONENT', Proc. 10th Int. Symp. Semiconductor manufacturing, 2001, pp. 247-250). This method is accurate, but it takes a long time to calculate. For example, it takes several hours to classify more than 1000 wafers. Therefore, with Example 5, failures with random distribution and failures with clustering distribution are distinguished using a simpler and easier method.

Figure 31A:
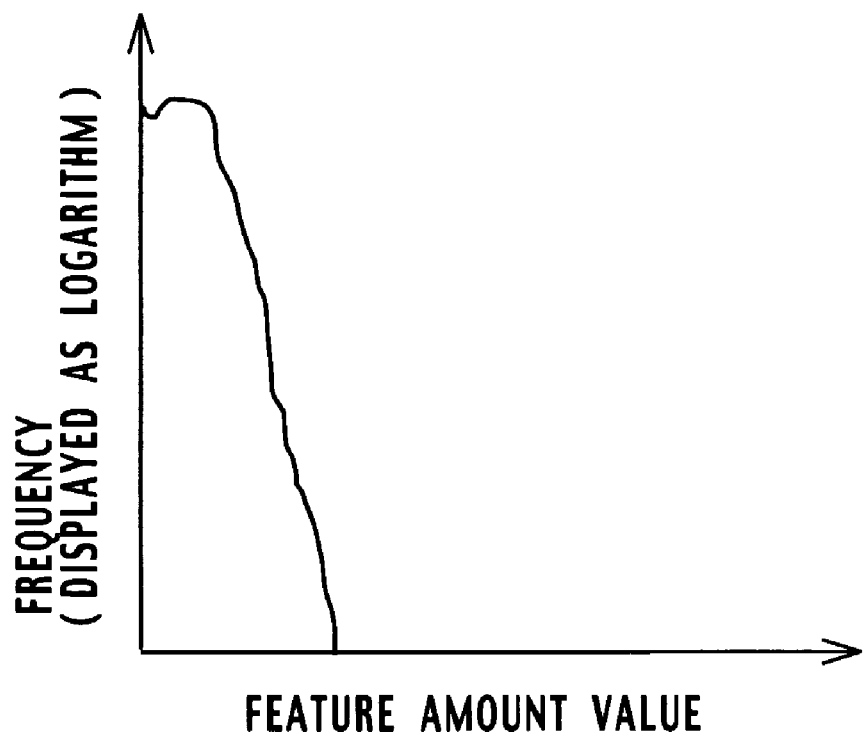
FIG. 31A is a graph showing frequency distribution of generalized wafer feature amounts, which has no clustering failures but has random failure distribution of Example 5.

As shown in FIG. 31A, frequency distribution f(x) with respect to each component x in the generalized feature amounts g for wafers with random failure distribution is similar to the Poisson distribution. Therefore, the frequency distribution f(x) of failures with random distribution is represented by an upwardly convex curve. Note that the vertical axis represents logarithms for frequencies.

Figure 31B:
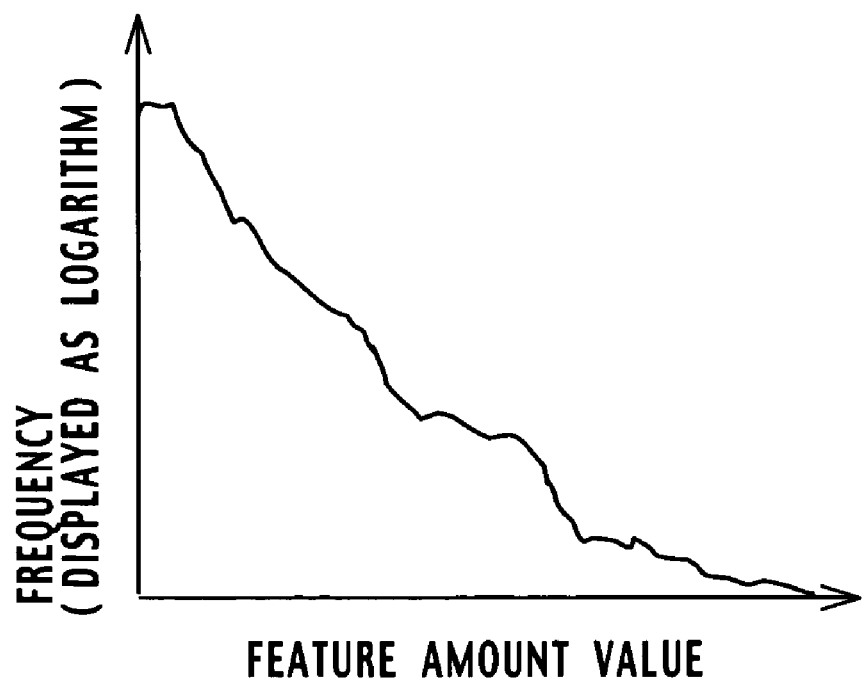
FIG. 31B is a graph showing frequency distribution of generalized wafer feature amounts, which has clustering failures of Example 5.

As shown in FIG. 31B, frequency distribution f(x) of wafer failures with clustering distribution is a distribution including the Poisson distribution plus the negative binominal distribution. Therefore, the frequency distribution f(x) for the failure clustering distribution is, in general, downwardly convex curve.

In step S4 in FIG. 2, the clustering failure identification unit 9 determines whether there are either failures with random distribution or failures with clustering distribution by identifying the characteristic of the curve of the frequency distribution f(x) in terms of each component x in the generalized feature amounts g for wafers, or identifying either an upward convex curve or a downward convex curve. For this classification, the logarithms for the frequency distribution f(x) are approximated by a quadratic function as shown in Expression (9). Here, the least-squares method is used for approximation.

$$\log(f(x)) = ax^2 + bx + c \quad (9)$$

Figure 32:
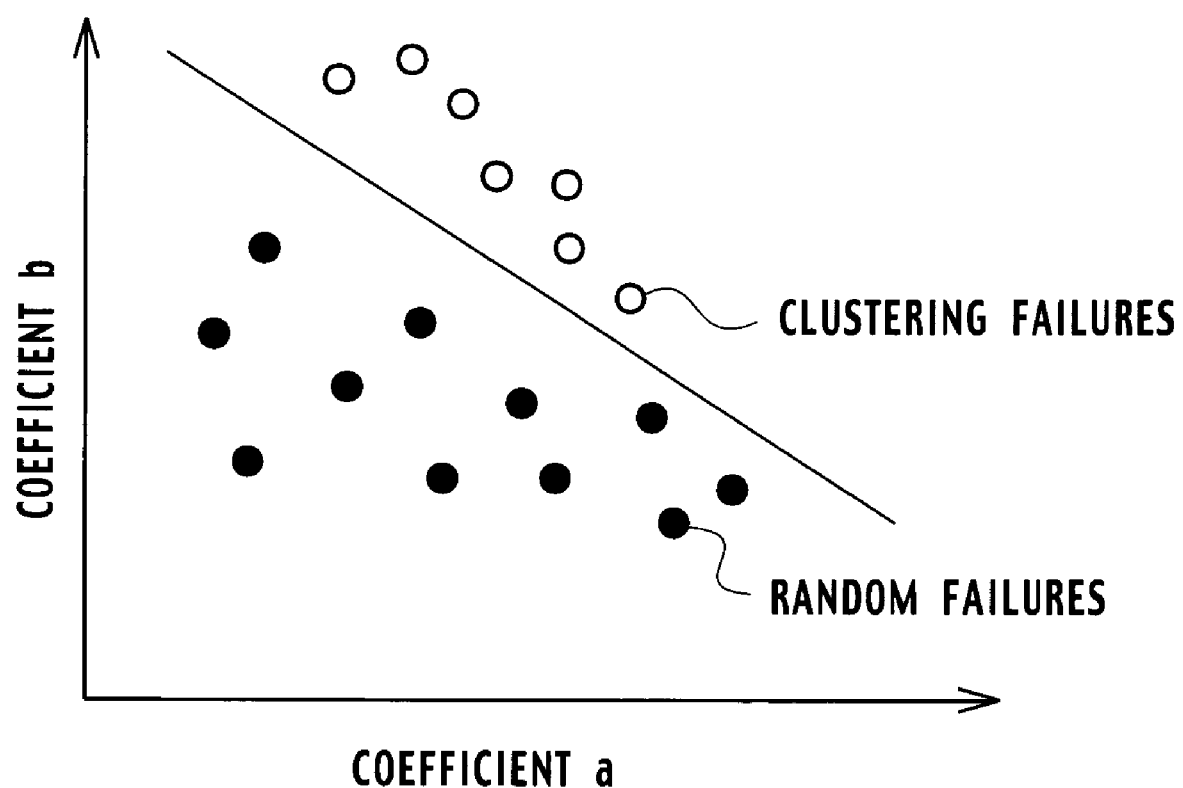
FIG. 32 is a graph for determining existence of clustering failures of Example 5.

The second-order and the first-order coefficients a and b of this quadratic function are calculated for each wafer. As shown in FIG. 32, in a coordinate plane with a second-order coefficient a axis and a first-order coefficient b axis on which the calculated second-order and the calculated first-order coefficients a and b for each wafer are plotted, the lower left area in which marks only for wafers with random distribution failures are plotted is clearly separated from the upper right area in which marks only for wafers with clustering distribution failures are plotted. Accordingly, it is possible to determine whether a wafer has either only random distribution failures or clustering distribution failures, which are included in the upper right area, by finding which of the lower left area or the upper right area of the coordinate plane of FIG. 32 each wafer belongs to, based on the second-order and the first-order coefficient a and b for each wafer. It takes 1/100 second or less per wafer, or 10 seconds or less per 1000 wafers to calculate for this determination, which means that approximately double-digit reduction in calculation time can be made compared to the conventional methods. After determination in this step S4, a step after step S7 in Example 1, or a step after step 5 in Example 4 is carried out. The step after step S7 in Example 1 or the step after step 5 in Example 4 is carried out for the wafers with clustering distribution failures rather than wafers with random distribution failures.

By Example 5, random distribution failures and clustering distribute failures are distinguished at high speed. This improves accuracy in classification of the failures according to the failure categories C.

As mentioned above, according to the failure analysis method of Example 5, failure distribution developed in each wafer can be automatically classified in units of wafer and even in units of lot. According to the failure analyzer of Example 5, failure distribution developed in each wafer can be automatically classified in units of wafer and even in units of lots.

EXAMPLE 6

In Example 6, based on the lot failure analysis method in FIG. 3, features of each lot configured with multiple wafers are represented by a representative lot value L for each failure category C for failure clustering distribution generated in Example 1; wherein the representative lot value L represents a group of multiple numerical values.

In addition, with Example 6, the similarity among lots in terms of wafer failure distribution development patterns is quantified using the representative lot value L. From this inter-lot similarity, lots with a similar wafer failure distribution pattern are grouped together and failure categories G for lots are automatically generated.

Figure 33:
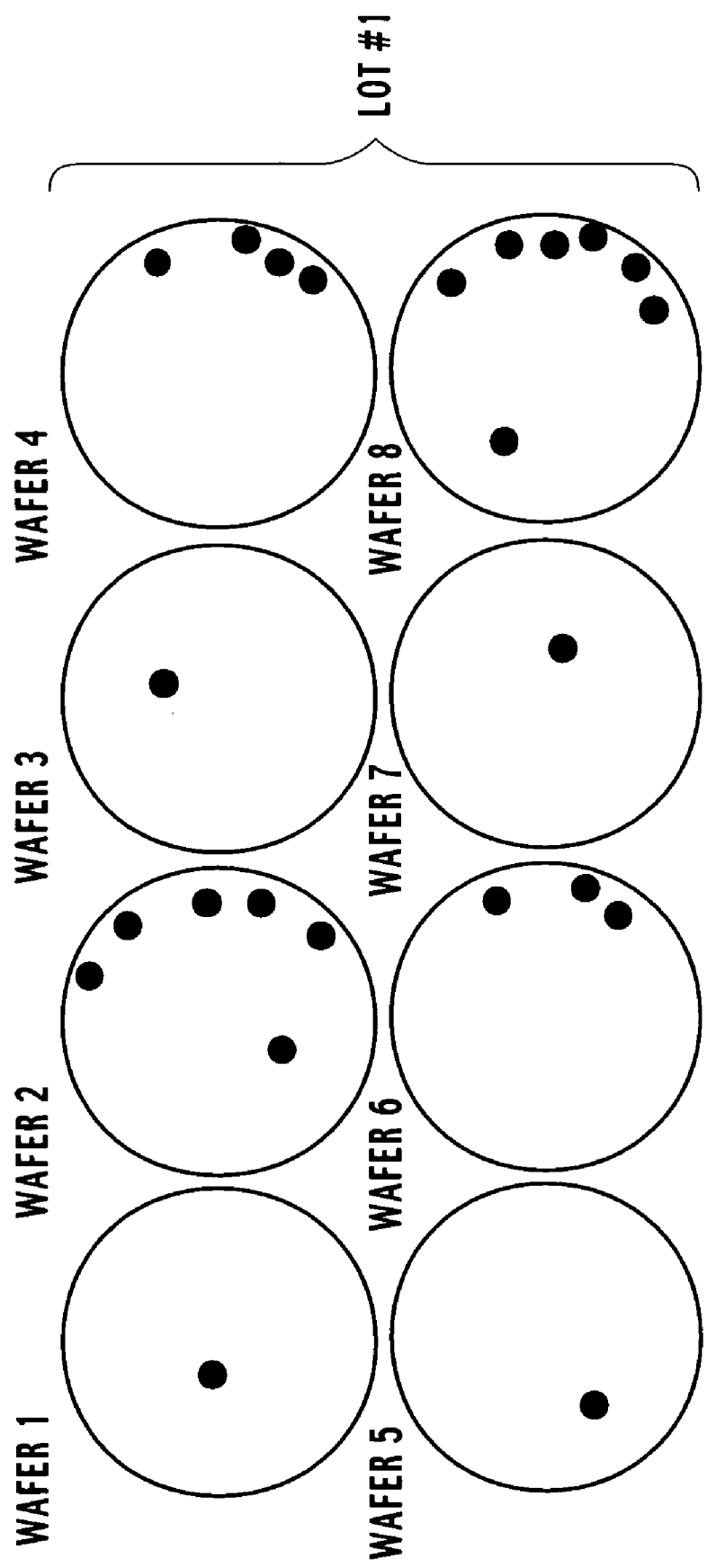
FIG. 33 is a diagram showing failure distribution on the wafers in lot # 1 of Example 6.
Figure 34:
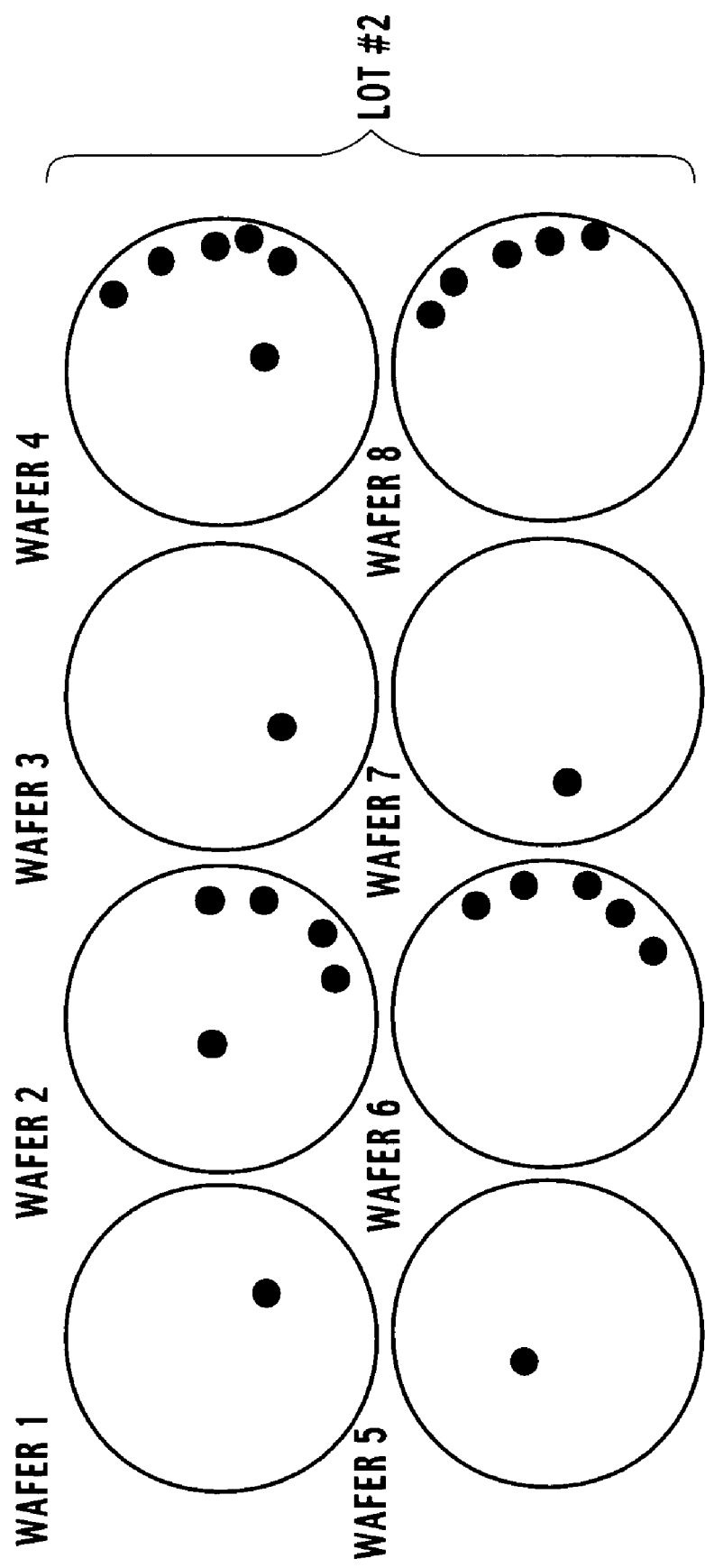
FIG. 34 is a diagram showing failure distribution on the wafers in lot # 2 of Example 6.
Figure 35:
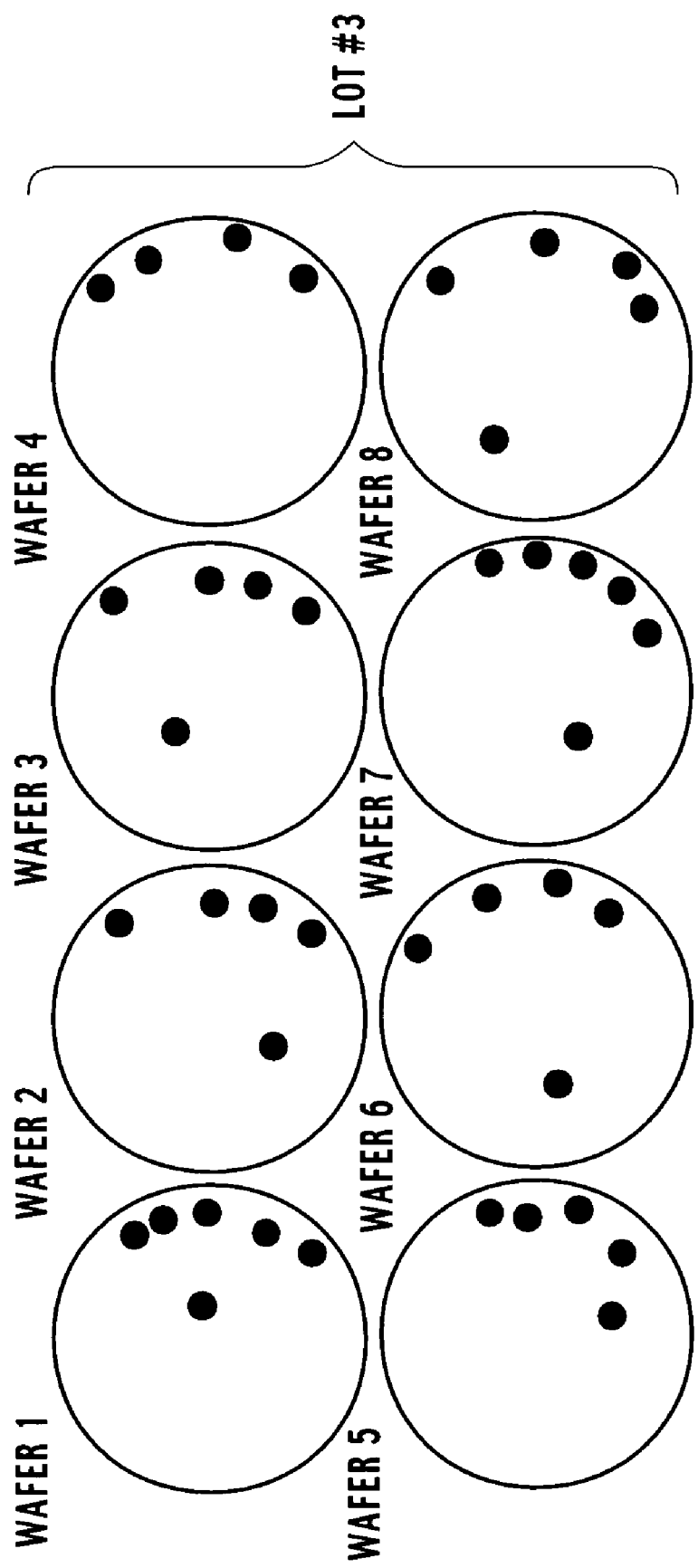
FIG. 35 is a diagram showing failure distribution on the wafers in lot # 3 of Example 6.

To begin with, in step S21, a target wafer ID is input to the input/output unit 34. For example, lot #1, which is a lot ID for lot #1 as shown in FIG. 33, is input. In addition, lot #2, which is a lot ID for lot #2 as shown in FIG. 34, is input. Furthermore, lot #3, which is a lot ID for lot #3 as shown in FIG. 35, is input.

In step S22, the target wafer detection unit 24 retrieves target wafer IDs for the target wafers configuring a target lot, from the process history stored in the process history storage unit 36. For example, wafer IDs for wafers 1 through 8, which configure lot #1 as shown in FIG. 33, are retrieved. In addition, wafer IDs for wafers 1 through 8, which configure lot #2 as shown in FIG. 34, are retrieved. Furthermore, wafer IDs for wafers 1 through 8, which configure lot #3 as shown in FIG. 35, are retrieved.

In step S23, the wafer failure analyzer 2 implements the wafer failure analysis method in FIG. 2 described in Example 1. Lots #1 through #3 have a common tendency to include wafers with many failures existing at the outer region thereof, which belong to wafer failure categories C. However, it is found that in lots #1 and #2, the wafers with many failures existing at the outer regions have even number IDs. On the other hand, in lot #3, failures are found at the outer regions of the wafers regardless of whether they have even or odd number IDs. As a result, it is estimated that the causes of failures existing at the outer regions of wafers are different among lots #1, #2, and lot #3.

In step S24, the wafer feature amount per failure categorized wafer calculation unit 25 defines wafer feature amounts Ci for the N number of failure categories C automatically generated. The wafer feature amounts Ci numerically represent failure distribution. The wafer feature amounts Ci represent the i-th failure category C. The wafer feature amount Ci is defined to increase as the failures look more remarkable or more distinct. The automatically generated failure categories C are a set of wafers with similar failure distributions. If these failure categories C include only wafers with similar clustering distribution failures, all other wafers in these failure categories C have similar failure clustering distributions. However, all of the wafers in the failure categories C are not necessarily similar to each other. In short, there are multiple failure grades such as strong or weak. Wafers with an extremely strong failure distribution may have a weak similarity in failure distribution with wafers with a weak failure distribution. As a result, it is thought that not all but a part of wafers being similar to a single arbitrary wafer belong to the failure category (100%). In other words, it is thought that the rate of the number of wafers being similar to an arbitrary wafer to the total number of other wafers belonging to the failure category is not 100% but an arbitrary value falling between zero and 100%. Therefore, the similarity rate sij for the j-th wafer j belonging to the failure category i is defined by Expression (10).

$$s_{ij} = n_{sij}/n_i \quad (10)$$

where, $n_{sij}$ denotes the number of wafers in the failure category i having similarity with wafer j, and $n_i$ denotes the total number of wafers other than wafer j belonging to the failure category i. The feature amount $C_i(j)$ of wafer j belonging to the failure category i is defined with the similarity sij by Expressions (11) and (12).

$$C_i(j) = s_{ij} \text{ (when wafer j belongs to the failure category i)} \quad (11)$$

$$C_i(j) = 0 \text{ (when wafer j does not belong to the failure category i)} \quad (12)$$

Here, it is thought that Ci(j) takes a value between 0 and 1, and as wafer j has a more apparent feature of failure clustering distribution belonging to the failure category i, Ci(j) takes a value closer to 1.

In a manufacturing line of a plant, a manufacturing step and a manufacturing device are used to process multiple lots of, for example, 25 wafers in a lot unit. Therefore, the malfunction of a manufacturing device often appears as wafer failures in units of lots. As a result, to identify a manufacturing device that malfunctions, the wafer feature amounts Ci(j) are converted to feature amounts Ci(w) for each lot. The feature amounts for the failure category i for wafers w(w=1 to 25) within each lot are referred to as Ci(w); where w denotes the number of wafer IDs.

Next, in step S25, the representative lot value L calculation unit 23 calculates the representative lot value L for the feature amounts Ci(w). The wafers in each lot belonging to the failure category i are found depending on the processing method of a manufacturing device that malfunctions. Therefore, it is important how to use the wafer feature amounts Ci(w) for 25 wafers in each lot.

The wafers in each lot belonging to the failure category i tend to develop failures in the following patterns.

(1) Develops equally regardless of the processing order of wafers in a lot.
(2) Suddenly develops due to the processing order of wafers in a lot.
(3) Develops due to a specific processing order of wafers in a lot, or develops only in either even wafer ID numbers or odd wafer ID numbers in a lot.
(4) Develops due to a specific wafer processing order, or develops only in either the first half of wafer ID numbers or the latter half of wafer ID numbers in a lot.
(5) Occurs in a specific lot due to a specific processing order, or develops only in specific wafer ID numbers in a specific lot.
(6) Periodically develops in a lot due to a specific wafer processing order, or in specific wafer ID numbers in a lot.

For example, (3) is a failure pattern that may occur in the case where a manufacturing device is configured with two vacuum chambers in which wafers in a lot are processed sequentially and alternately, and one of those vacuum chambers happens to malfunction.

The feature amounts representing those lot failure patterns are representative lot values L. The following six types of feature amounts are considered to be the representative lot values L, which represent the aforementioned failure patterns.

(1) Average lot value: μI; the rate of failure wafers in a lot: Ki
(2) The intra-lot maximum value: Mi
(3) Degree of even/odd-caused inhomogeneous distribution (IDi; ,, Di)
(4) Degree of first/latter half-caused inhomogeneous distribution (IFi; ,, Fi)
(5) Degree of wafer number-caused inhomogeneous distribution ,, Wi(w) (w denotes the number of wafer IDs from 1 to 25.)
(6) Periodic regularity Pi(p) (p denotes wafer periods from 3 to 12.)

To begin with, the average lot value μi L (1) of the above representative lot values is equal to the average value of wafer feature amounts Ci(w) for wafers w in a lot. Regarding the rate of wafer failures in a lot Ki, to begin with, the threshold for the wafer feature amounts Ci(w) defined by the intra-failure category i similarity sij is set to 0.25. As seen from Expression (13), the rate of failure wafers in a lot Ki is equal to the ratio of the number of wafers w having an intra-failure category similarity found based upon the wafer feature amounts Ci(w) being equal to or greater than the threshold of 0.25 (nfi) to the total number of wafers w in a lot (nl).

$$K_i = n_{fi}/n_l \quad (13)$$

The intra-lot maximum value Mi (2) in the above representative lot values L is the intra-lot maximum value of the wafer feature amounts Ci(w).

Regarding degree of even/odd-caused inhomogeneous distribution (IDi; ,, Di) (3) in terms of the representative lot values L, wafers in a lot are divided into two groups: the first group with even wafer numbers and the second group with odd wafer numbers, and of the number of the intra-lot wafers belonging to the failure category i (nfi), the number of even numbered wafers (nf1) and the number of odd numbered wafers (nf2) are calculated. Therefore, an equation of nf1+nf2=nfi holds true. In addition, of the total number of intra-lot wafers nl, the number of wafers with even wafer numbers nl1 and number of wafers with odd wafer numbers nl2 are calculated. Therefore, an equation of nl1+nl2=nl holds true. The degrees of even/odd-caused inhomogeneous distribution (IDi; ,, Di) are then calculated using Expressions (14) through (17).

$$I_{Di} = 1 - 2\frac{n_{f1}}{n_{f1}+f_{f2}} \tag{14}$$

$$\chi_{Di} = \frac{(n_{f1}-e_1)^2}{e_1} + \frac{(n_{f2}-e_2)^2}{e_2} \tag{15}$$

where, $$e_1 = n_{fi}\frac{n_{l1}}{n_{l1}+n_{l2}} \tag{16}$$

$$e_2 = n_{fi}\frac{n_{l2}}{n_{l1}+n_{l2}} \tag{17}$$

where, IDi indicates which of either even wafer numbered wafers or odd wafer numbered wafers tend to have more failures within a lot. IDi takes consecutive values between +1 and −1. If the wafers with even wafer numbers have more failures, IDi is set to −1; otherwise, if wafers with odd wafer numbers have more failures, IDi is set to +1; otherwise, if both wafer numbers of wafers have failures equally, IDi is set to zero. ,, Di is a ,, $^2$ (chi-squared) value, which indicates a tendency for many failures to concentrate either in even wafer numbered wafers or odd wafer numbered wafers.

The degree of first/latter half-caused inhomogeneous distribution (IFi; ,, Fi) (4) in terms of the above representative lot values L may be found as with the degree of even/odd-caused inhomogeneous distribution (IDi; ,, Di). In other words, intra-lot wafers should be divided into the first half and the latter half based upon wafer numbers, in place of even or odd numbers.

Regarding the degree of wafer number-caused inhomogeneous distribution ,, Wi(w) (5) in terms of the above representative lot value, intra-lot wafers are divided into two groups: the first group with wafers w and the second group with the other wafers, and a ,, $^2$ (chi-squared) value is calculated using Expressions (15) through (17). The stronger the tendency for failures to occur only in the wafers w, the larger the degree of wafer number-caused inhomogeneous distribution ,, Wi(w) becomes. Note that the number of wafers w is not limited to just one, and the degree of wafer number-caused inhomogeneous distribution ,, Wi(w), which indicates the degree of inhomogeneous distribution tending to develop in two wafers w or more, may be found. For example, with a manufacturing device that batch-processes in units of 25 wafers, failures may be developed only in a wafer w with a specific wafer number. Alternatively, when 25 wafers are processed in two batches with 12 wafers in the first batch and 13 wafers in the latter using a manufacturing device that batch-processes in units of 13 wafers, failures may be developed only in wafers w with the wafer numbers of, for example, 2 and 14, which have been processed at the same point in time from the beginning of each batch processing.

Regarding the periodic regularity Pi(p) (6) in terms of the above representative lot value, the wafer feature amounts Ci(w) are regarded as a waveform data for a wafer w. With this premise, the autocorrelation function Raci(k) in terms of the wafer feature amounts Ci(w) is found using Expressions (2) through (4). The autocorrelation function Raci(k) takes a value between −1 and +1. The autocorrelation function Raci(k) starts from Raci(0)=1, and the first local maximum point corresponds to the cycle period of the waveform of the wafer feature amounts Ci(w). The clearer the periodicity of the wafer feature amounts Ci(w) is, the larger the value of the autocorrelation function Raci(k) at the local maximum point. The cycle period p is given by k at the local maximum point of the autocorrelation function Raci(k). On the other hand, the larger the value of Raci(p) with the cycle period p, the clearer the regularity of the cycle period p for intra-lot wafers w exists. Note that the degree of even/odd-caused inhomogeneous distribution (IDi; ,, Di) (3) in terms of the representative lot values L may be the regularity with a cycle period of p corresponding to a period of time for two wafers. Therefore, the periodic regularity Pi(p) should be regularity with a cycle period of p for three or more wafers. As a result, the periodic regularity Pi(p) (p=3 to 12) is defined for the representative lot values L using Expression (18).

$$P_i(p)=\text{Rac}_i(p) \tag{18}$$

Next, in step S26, the representative lot value L calculation unit 23 aligns the representative lot values L. In the case where there are M representative lot values L corresponding to the respective N failure categories i automatically generated in step S23, there are (N×M) representative lot values L. The set of representative lot values L aligned in a certain order is thought as Expression (19).

$$L=(L_1,L_2,\Lambda,L_j,\Lambda,L_{N*M}) \tag{19}$$

The representative lot values L include, for example, a representative lot value L1, which is the average lot value μ1 of lot values in the lot failure category C1, and a representative lot value Lj, which is the degree of wafer number-caused inhomogeneous distribution ,, Wi(3) for wafer 3 in the lot failure category C2. The representative lot values L are calculated for each of lot #1 through #3. In Example 6, the number of representative lot values L for lots #1 through #3 (M) is set to forty-two including: the average lot value μ1, the rate of failure wafers in a lot Ki, the intra-lot maximum value Mi, two kinds of degree of even/odd-caused inhomogeneous distribution (IDi; ,, Di), two kinds of degree of first/latter half-caused inhomogeneous distribution (IFi; ,, Fi), 25 types of degree of wafer number-caused inhomogeneous distribution ,, Wi(w) for 25 wafers, and ten kinds of periodic regularities Pi(p), which correspond to the respective periods of time p for 3 to 12 wafers.

Figure 36A:
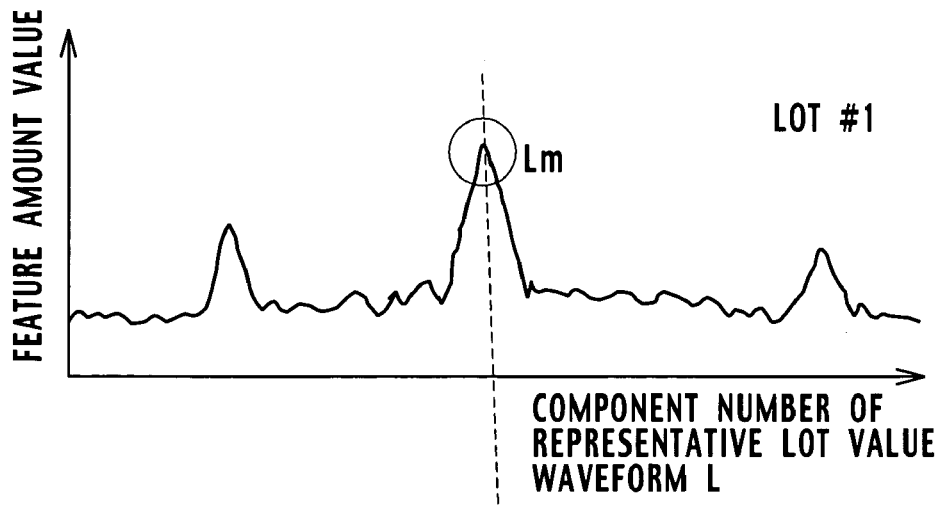
FIG. 36A is a waveform of representative lot values in lot # 1 of Example 6.
Figure 36B:
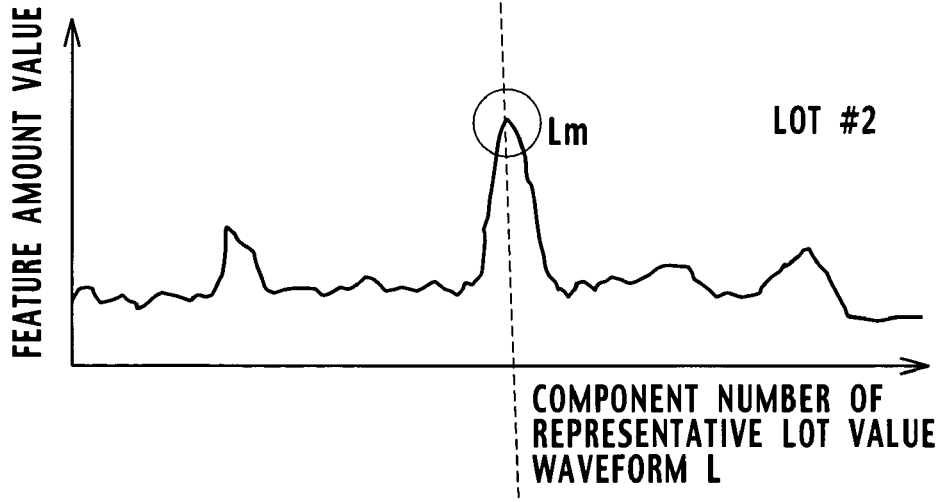
FIG. 36B is a waveform of representative lot values in lot # 2 of Example 6.
Figure 36C:
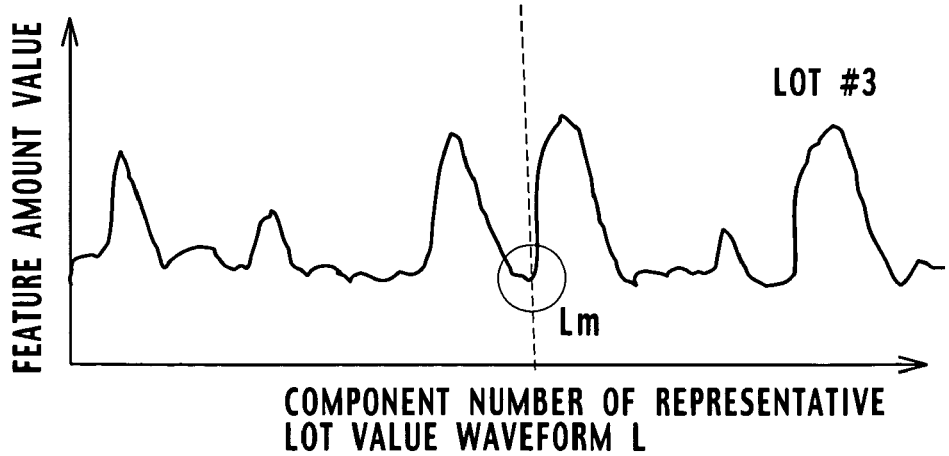
FIG. 36C is a waveform of representative lot values in lot # 3 of Example 6.

As shown in FIGS. 36A through 36C, when the representative lot values L for each lot #1 through #3 are plotted in graphs, they can be viewed as waveforms. These are called waveforms of representative lot values L. It is found that the waveforms of representative lot values for lots #1 and #2 are similar to each other. On the other hand, the waveform for the lot #3 differs from each of those of the representative lot values L for lots #1 and #2. As shown in FIGS. 33 through 35, wafers in those lots #1 through #3 belong to the same wafer failure category i, which tends to include wafers with a larger number of failures at the outer regions. However, in lots #1 and #2, wafers w with even wafer numbers have more failures gathered at the outer regions. On the other hand, in lot #3, the failures equally gather at the outer regions of the wafers regardless of wafer number. Therefore, it can be estimated that the causes of failures are different among lots #1, #2, and #3 even if the wafers in lots #1 through #3 belong to the same failure category i, which includes wafers with more failures gathered at the outer regions. In this way, those lots can be distinguished by finding each waveform of the representative lot values L. The representative lot values L correspond to an intra-lot failure development pattern for each wafer belonging to the automatically generated failure category i in terms of the wafer feature amounts Ci(w). The waveforms of the representative lot values L allow determination of similarity between inter-lot failure development patterns and estimation of difference in the causes of inter-lot failures.

Figure 37A:
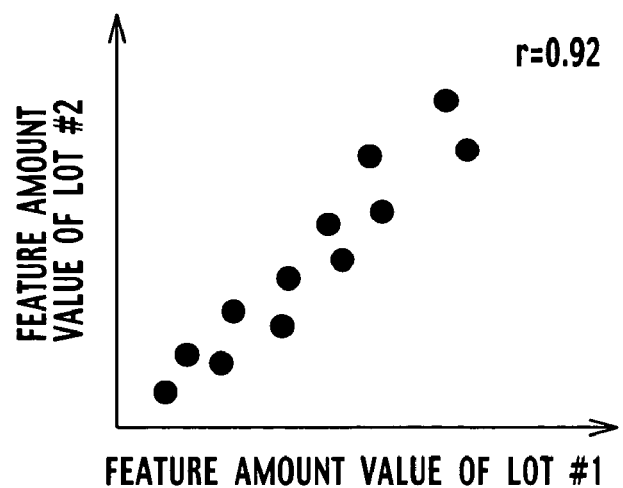
FIG. 37A is a graph showing correlation between lot # 1 and lot # 2 of Example 6.
Figure 37B:
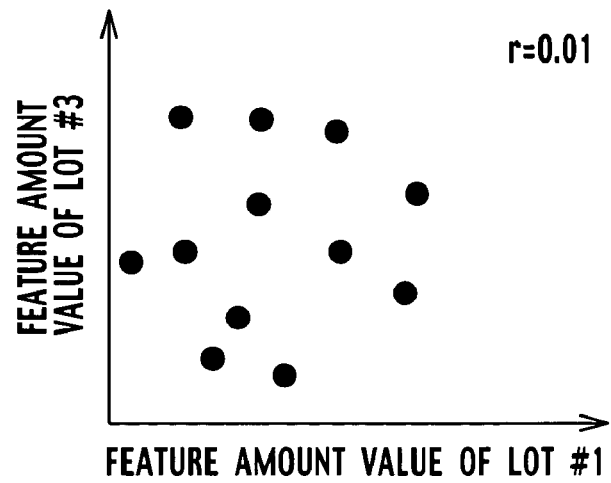
FIG. 37B is a graph showing correlation between lot # 1 and lot # 3 of Example 6.
Figure 37C:
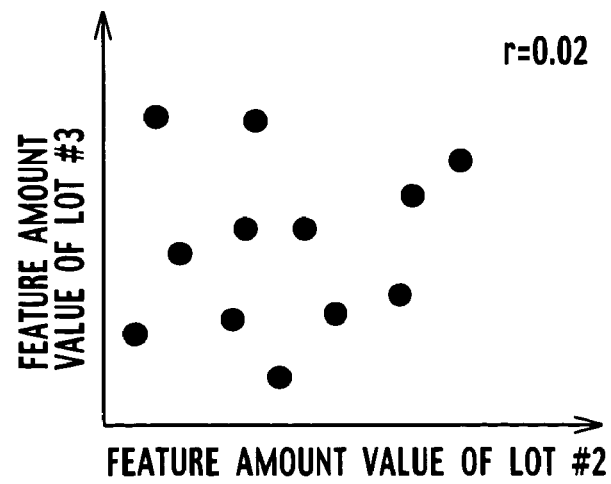
FIG. 37C is a graph showing correlation between lot # 2 and lot # 3 of Example 6.

In step S28, to begin with, the inter-lot correlation coefficient calculation unit 26 generates scatter diagrams as shown in FIGS. 37A through 37C, each having plotted representative lot values L for two lots. From the scatter diagrams, correlation between lots can be seen. It is found in FIG. 37A that there is strong correlation between lots #1 and #2 in terms of the representative lot values L. On the other hand, there is little correlation between lots #1 and #3 in FIG. 37B in terms of the representative lot values L. In addition, there is little correlation between lots #2 and #3 in FIG. 37C in terms of the representative lot values L.

Next, to quantify the correlations, the correlation coefficient rij between lots i and j in terms of the representative lot values L is calculated using Expressions (5) through (8). This allows quantification of the similarity between lots in terms of failure development patterns. gk and hk denote some of the representative lot values L for the lots i and j, respectively.

The correlation coefficient r12 between lots #1 and #2 is 0.92. The correlation coefficient r13 between lots #1 and #3 is 0.01. The correlation coefficient r23 between lots #2 and #3 is 0.02.

In step S29, to begin with, the similar lot detection unit 27 sets the threshold to 0.6. If the correlation coefficient rij is equal to or greater than the threshold of 0.6, it is determined that those lots i and j have similar failure distributions. The correlation coefficients rij being greater than the threshold of 0.6 are the correlation coefficients r12 and r21. Other correlation coefficients rij are less than the threshold of 0.6. As described above, the correlation coefficients rij between lots in terms of the representative lot values L can be used to quantify and determine the similarity between lots.

In step S30, the similar lot set generation unit 28 generates similar lot sets S. The lots configuring these similar lot sets S can be grouped together using the same method of grouping wafers described in Example 1. The similar lot sets S are generated by detecting other similar lots with each single lot.

In step S31, the similarity calculation unit 29 calculates the similarity Rij between the similar lot sets Si and Sj. The similarity Rij is defined by the rate of lots correlating with each other in the similar lot sets Si and Sj. In other words, the similarity Rij is defined as the ratio of the number of paired lots correlating with each other to the total number of paired lots belonging to the similar lot sets Si and Sj. The threshold of the similarity Rij is set to 0.4. It is determined that the similar lot sets Si and Sj with the similarity Rij greater than the threshold of 0.4 are similar to each other. Note that the similarity Rij may be defined as the ratio of the number of lots belonging to both similar lot sets Si and Sj to the total number of lots belonging to at least either the similar lot set Si or Sj.

Next, in step S32, the sorting unit 30 sorts the similar lot sets Si in the decreasing order of the number of elements or the number of lots.

In step S33, the failure category generation unit 31 groups the similar lot sets Si in the order from the sorted and highest ranked similar lot set Si, while referencing the determination result of the similarity Rij. The lot failure category G is then assigned as an identifier to the similar lot set Si belonging to this group.

In step S34, the characteristic representative lot value determination unit 32 calculates the characteristic representative lot value Lm of the lot failure category G, which is a statistic value used to identify the cause of failures developed in wafers in the lot belonging to the lot failure category G.

To begin with, paying attention to the failure category Gi for a certain lot, the similarity S(Gi) among lots within the failure category Gi is defined using Expression (20).

$$S(G_i) = \sum_{j,k \in Gi} r_{jk} \quad (20)$$

It is thought that the correlation coefficient rjk between the waveforms of the representative lot values L indicates the similarity between lots j and k. Note that the correlation coefficient rjk indicating the similarity between lots j and k may be found by calculating the residual sum of squares of damping waveforms to be described in Example 7. As shown in Expression (20), to find the similarity S(Gi) among lots belonging to the lot failure category Gi, correlation coefficients rjk for all lots belonging to the lot failure category Gi are added together. The similarity S(Gi,Lm) between lots belonging to the failure category Gi when the m-th component Lm is excluded from the representative lot values L is then found using Expression (20) as well. The component Lm and the order m of the representative lot values L, which allows the difference S(Gi)−S(Gi,Lm) to be the maximum, are then calculated; wherein the similarity S(Gi) is the one between lots belonging to the failure category Gi, and the similarity S(Gi,Lm) is the similarity between lots belonging to the failure category Gi. As shown in FIGS. 36A through 36C, the component Lm of the representative lot values L that allows the difference S(Gi)−S(Gi,Lm) to be the maximum is thought as the representative lot value Lm that most characterizes the lots belonging to the failure category Gi.

In step S35, as shown in FIGS. 36A through 36C, the common device identification unit 33 can identify a manufacturing device, which has brought about failures in the failure category Gi, by searching for that manufacturing device, which has unevenly processed lots #1 and #2 with a large representative lot value Lm that is the most characteristic in the failure category Gi but has not processed lot #3 with a small Lm, while referencing the process history of the lot manufacturing device stored in the process history storage unit 36 in FIG. 1 and the representative lot value Lm that is the most characteristic in the failure category Gi.

Figure 38A:
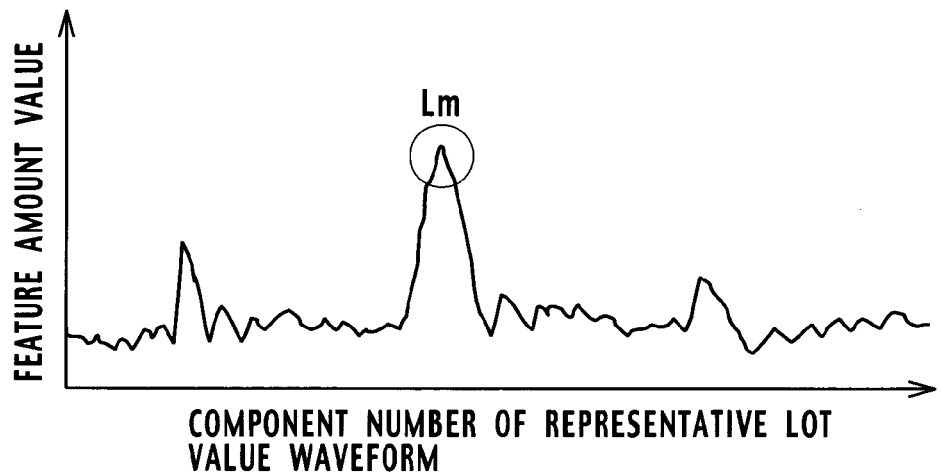
FIGS. 38A through 38C are waveforms of representative lot values, which are the most characteristic in the failure categories for other lots of Example 6.
Figure 38B:
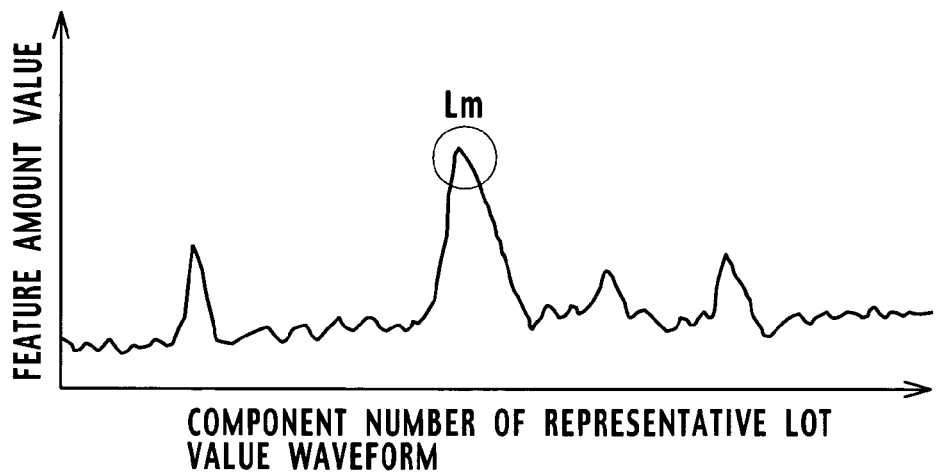
Figure 38C:
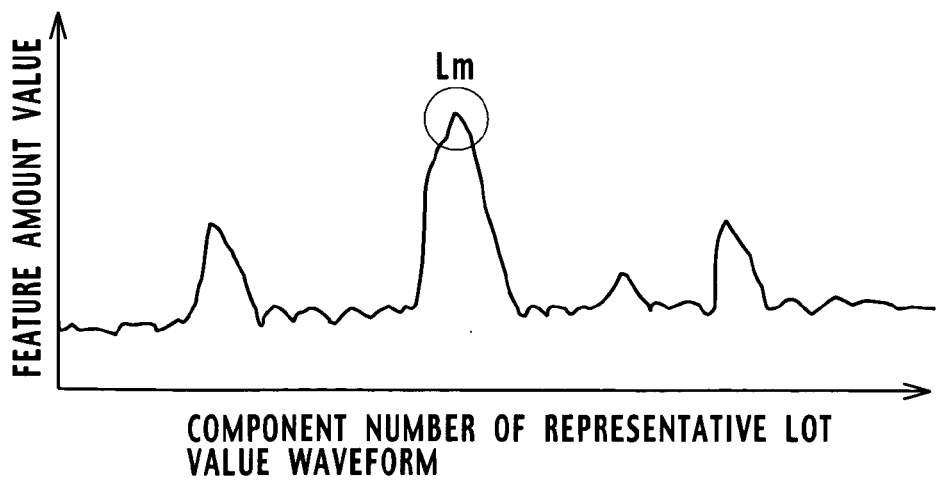

Note that as shown in FIGS. 38A through 38C, when the lots in FIGS. 38A through 38C have the large representative lot value Lm that is the most characteristic in the failure category Gi, it is possible to identify a manufacturing device, which has brought about failures belonging to the failure category Gi, by searching for that manufacturing device that commonly processes those three lots in FIGS. 38A through 38C.

In Example 6, only the definition of the similarities between wafers and between lots is given, but failure samples are not provided in advance. Each of the respective target lots is viewed as a sample, and sets of wafers and sets of lots with similar failure distributions are formed as wafer failure categories C and lot failure categories G, respectively. This allows automatic detection of failure patterns an operator cannot anticipate in advance.

As mentioned above, according to the failure analysis method of Example 6, a failure distribution developed in each wafer can be automatically classified in units of wafer and even in units of lot. According to the failure analyzer of Example 6, a failure distribution developed in each wafer can be automatically classified in units of wafer and even in units of lot.

EXAMPLE 7

In Example 7, in steps S26 and S27 of FIG. 3, lots having wafers with similar failure distribution development patterns are identified using the representative lot values L defined in Example 6. For this identification, the alignment order of the representative lot values L is taken into account.

Employment of steps S26 and S27 allows omission of steps S28 and S29 of Example 6. In this case, similarity between lots can be found by determining whether or not both of the autocorrelation coefficients are large and the difference between the autocorrelation coefficients is equal to or less than a certain value.

The representative lot values L make different waveforms depending on the alignment order thereof. In Example 4, an alignment order capable of showing regularity is selected by referencing a designated order library. In Example 7, an alignment order capable of showing a damping waveform of the representative lot values L for a certain lot is used for other lots.

Figure 39A:
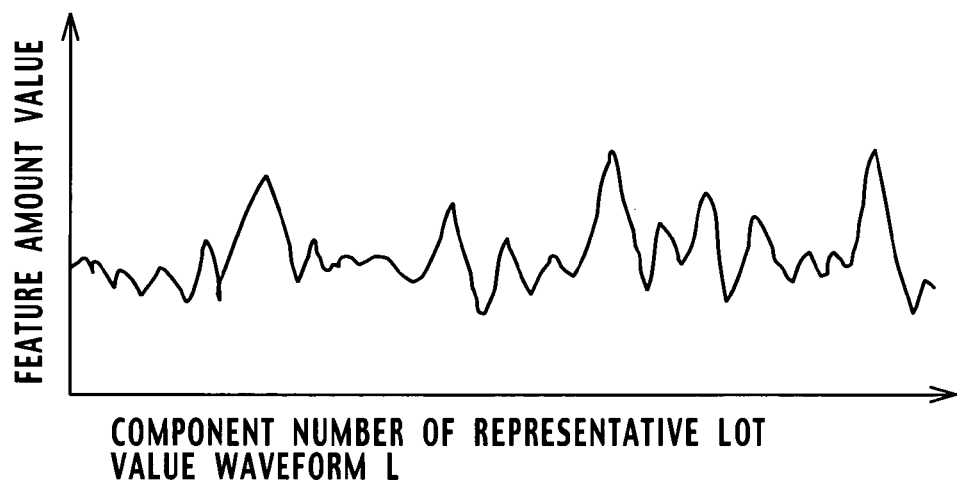
FIG. 39A is a waveform showing representative lot values before resorting in Example 7.

For example, Example 4 is used for the waveform of the representative lot values L for lot #4 as shown in FIG. 39A.

Figure 39B:
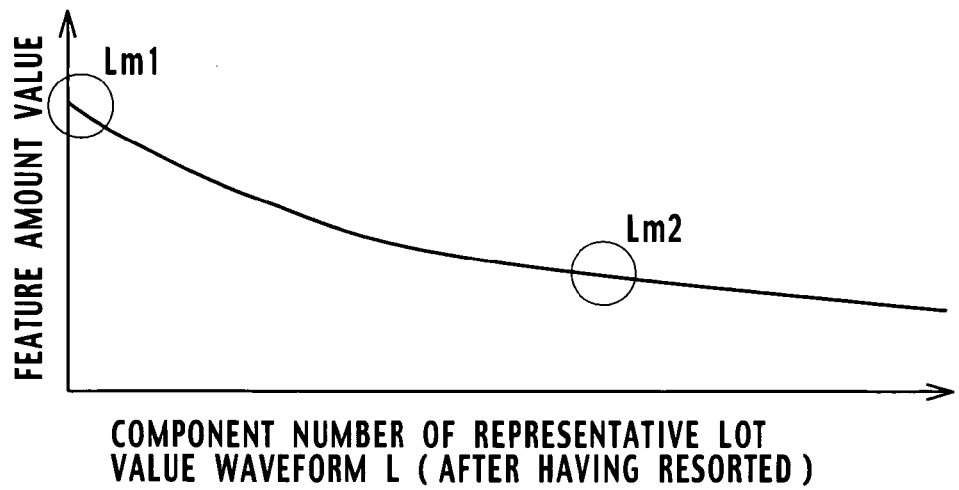
FIG. 39B is a waveform showing representative lot values after having resorted in Example 7.
Figure 40A:
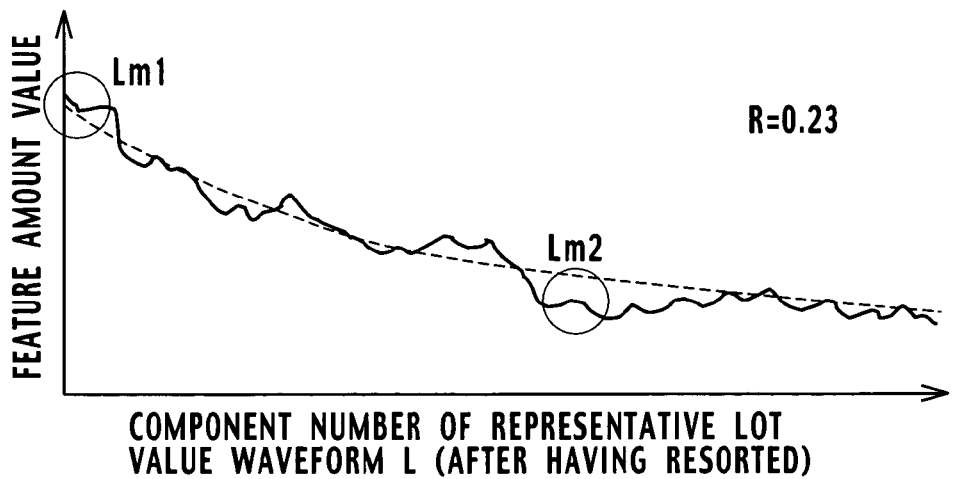
FIGS. 40A through 40C are waveforms showing representative lot values in other lots after having resorted, so as to be the same order as those in FIG. 39B.
Figure 40B:
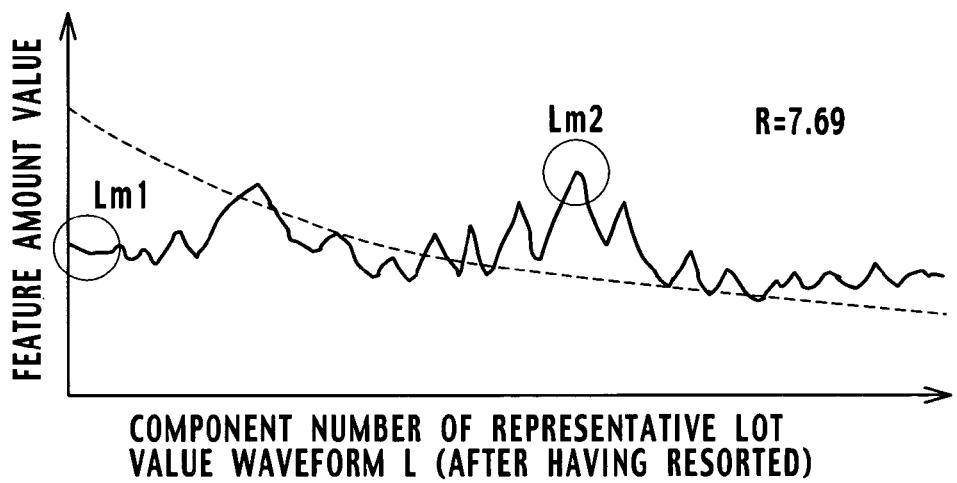
Figure 40C:
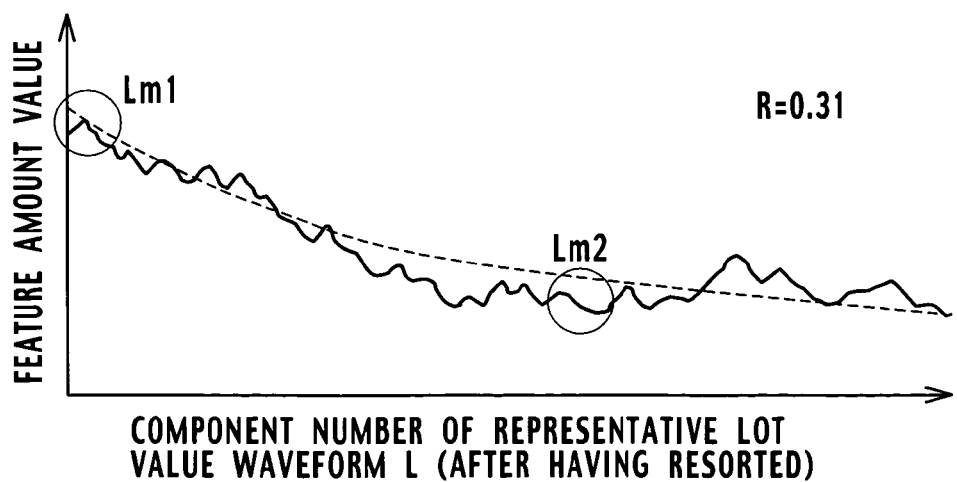

To begin with, in step S26, the similar lot detection unit 27 forms a reference waveform by sorting the representative lot values L of lot #4 in decreasing order of the values so that the waveform of the representative lot values L for lot #4 can be converted into a damping waveform as shown in FIG. 39B. Next, as shown in FIGS. 40A through 40C, the alignment order after sorting is used for other lots #5 through #7 to form waveforms thereof. As a result, the waveform of lot #5 in FIG. 40A is similar to the waveform of lot #4. The waveform of lot #6 in FIG. 40B is not similar to the waveform of lot #4. The waveform of lot #7 in FIG. 40C is similar to the waveform of lot #4. Dotted lines in FIGS. 40A through 40C are reference waveforms of lot #4 in FIG. 39B.

In step S27, the similar lot detection unit 27 calculates the residual sum of squares R with the reference waveform, which is formed from lot #4, for each of the waveforms for lots #5 through #7 in FIGS. 40A through 40C. As a result, the residual sum of squares R of lot #5 is 0.23. The residual sum of squares R of lot #6 is 7.69. The residual sum of squares R of lot #7 is 0.31. Lots #5 and #7 have a small residual sum of squares R, but lot #6 has a large one.

Omitting the execution of step S28, in step S29, to begin with, the similar lot detection unit 27 sets a threshold for the residual sum of squares R to 2.0. Instead of the correlation coefficient rij, if the residual sum of squares R is equal to or less than the threshold of 2.0, it is determined-that lots #5 through #7 with the residual sum of squares R and lot #4 with the reference waveform have similar failure distributions. As shown in FIGS. 40A through 40C and 41, the lots having the residual sum of squares R with respect to lot #4, which has the reference waveform, being equal to or less than the threshold of 2.0 are lots #5 and #7. In this way, lots #5 and #7 being similar to lot #4 can be detected. Note that the reference waveform for the waveform of the representative lot values L may be a monotone increasing waveform in place of the damping waveform.

As described above, usage of the alignment order for all other lots, which is used to convert the waveform of the representative lot values L for a certain lot to a damping waveform, allows quantification of the similarity of a lot with this certain lot, and automatic detection of lots similar to this certain lot.

Figure 41:
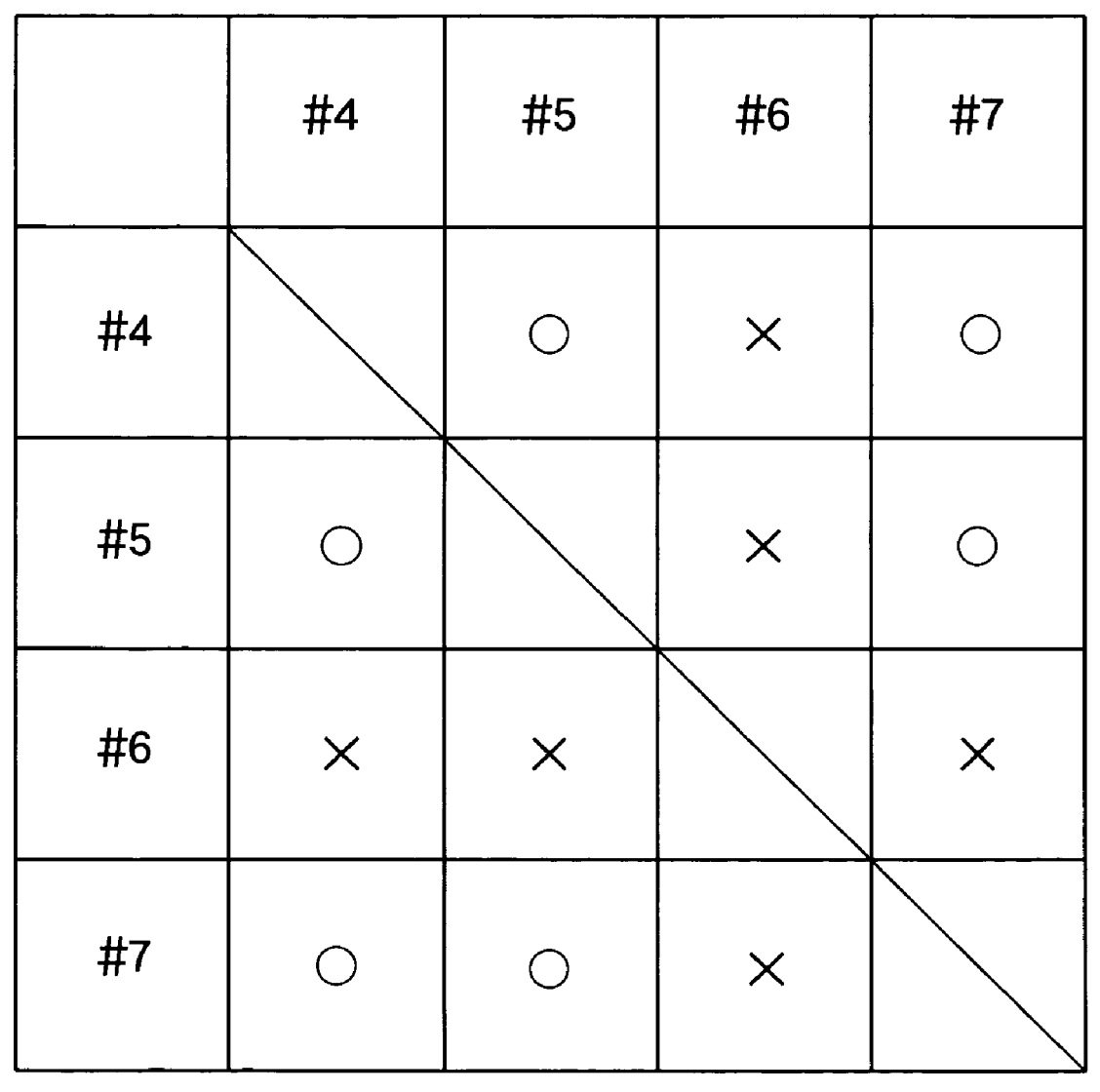

Note that lots #5 through #7 are selected to generate respective reference waveforms, and the above steps S26 and S27 are performed for each of these lots #5 through #7 to detect similar lots, as shown in FIG. 41. As a result, lots #4 and #7 being similar to lot #5 can be detected. No lot being similar to lot #6 can be detected. Lots #4 and #5 being similar to lot #7 can be detected.

The following implementation is the same as after step S30 in Example 6.

In step S30, as shown in FIG. 42, similar lot sets S4 through S7 are formed. The elements in the similar lot set S4 are three lots #4, #5, and #7. The elements in the similar lot set S5 are three lots #4, #5, and #7. The element in the similar lot set S6 is a single lot #6. The elements in the similar lot set S7 are three lots #4, #5, and #7.

In step S31, the similarity Rij between the similar lot sets Si and Sj is calculated. In this case, the similarity Rij is defined as the ratio of the number of lots belonging to both of the similar lot sets Si and Sj to the total number of lots belonging to at least either the similar lot set Si or Sj. The threshold of the similarity Rij is set to 0.3. It is determined that the similar lot sets Si and Sj with a greater similarity Rij than the threshold of 0.3 are similar to each other. The similarity R45 between the similar lot sets S4 and S5 is 3/3 or 1.0. Since the similarity R45 is 1.0 or greater than the threshold of 0.3, it is determined that the similar lot sets S4 and S5 are similar to each other as shown in FIG. 42. The similarity R47 between the similar lot sets S4 and S7 is 3/3 or 1.0. Since the similarity R47 is 1.0 or greater than the threshold of 0.3, it is determined that the similar lot sets S4 and S7 are similar to each other. The similarity R46 between the similar lot sets S4 and S6 is 0/4 or zero. Since the similarity R46 is zero or less than the threshold of 0.3, it is determined that the similar lot sets S4 and S6 are not similar to each other. The similarity R57 between the similar lot sets S5 and S7 is 3/3 or 1.0. Since the similarity R57 is 1.0 or greater than the threshold of 0.3, it is determined that the similar lot sets S5 and S7 are similar to each other. The similarity R56 between the similar lot sets S5 and S6 is 0/4 or zero. Since the similarity R56 is zero or less than the threshold of 0.3, it is determined that the similar lot sets S5 and S6 are not similar to each other. The similarity R76 between the similar lot sets S7 and S6 is 0/4 or zero. Since the similarity R76 is zero or less than the threshold of 0.3, it is determined that the similar lot sets S7 and S6 are not similar to each other.

Next, in step S32, the similar lot sets Si are sorted in decreasing order of the number of lots belonging thereto, and the similar lot sets S4, S5, S7, and S6 are aligned in this written order as shown in FIG. 42.

In step S33, the similar lot sets S4, S5, and S7 are grouped in the decreasing order of the sorted and higher ranked similar lot set S4, while referencing the similarity determination result from the similarities R45, R47, and R46. A lot failure category G1 is then assigned as an identifier to the similar lot sets S4, S5, and S7 belonging to this group. Since only the similar lot set S6 is not grouped, the similar lot set S6 configures a single group, and a lot failure category G2 is assigned as an identifier to the similar lot set S6 belonging to that group.

In step S34, as shown in FIGS. 39B, and 40A through 40C, the characteristic representative lot values Lm1 and Lm2, which are statistic values used to identify the cause of wafer failures in each lot belonging to the respective categories G1 and G2, are calculated for each of the lot failure categories G1 and G2.

In step S35, as shown in FIGS. 39B, and 40A through 40C, it is possible to identify a manufacturing device, which has brought about failures belonging to the failure category G1, by searching for that manufacturing device, which has unevenly processed lots #4, #5, and #7 with a large representative lot value Lm1 that is the most characteristic in the failure category G1 and has not processed lot #6 with a small Lm1, while referencing the process history of the lot manufacturing device and the representative lot value Lm1 that is the most characteristic in the failure category G1. Similarly, it is possible to identify a manufacturing device, which has brought about failures belonging to the failure category G2, by searching for that manufacturing device, which has unevenly processed lot #6 with the large representative lot value Lm2 that is the most characteristic in the failure category G2 but not processed lots #4, #5, and #7 with a small Lm2.

In Example 7, only the definition of the similarity between wafers or between lots is given, and failure samples are not given in advance. Each of the respective target lots is viewed as a sample, and sets of wafers and sets of lots with similar failure distributions are formed to belong to wafer failure categories C and lot failure categories G, respectively. This allows automatic detection of failure patterns an operator cannot anticipate in advance.

As mentioned above, according to the failure analysis method of Example 7, a failure distribution developed in each wafer can be automatically classified in units of wafer and even in units of lot. According to the failure analyzer of Example 7, a failure distribution developed in each wafer can be automatically classified in units of wafer and even in units of lot.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A method for analyzing fail bit maps comprising:
   inputting positions of failures in wafers;
   preparing sections on the wafers;
   calculating feature amounts configured to represent distributions of the failures in the wafers for each of the sections by at least one numerical value;
   calculating a first numerical value configured to represent a degree of similarity between the feature amounts of the wafers; and
   detecting another wafer having the first numerical value greater than a predetermined first threshold for each of the wafers, and forming similar wafer groups of the wafers having the distributions of the failures similar to each other,
   wherein calculating the first numerical value includes at least one of:
   calculating a first correlation coefficient between the feature amounts of the wafers;
   performing a Fourier transformation regarding the feature amounts as waveforms and comparing first spectra of the Fourier transformation of the waveforms; and
   using a maximum entropy method.

2. The method as claimed in claim 1, further comprising:
   finding another similar wafer group having a first ratio of the number of the wafers included in both of said another similar wafer group and each one of the similar wafer groups to the number of the wafers included in at least one of said another similar wafer group and the each one of the similar wafer groups to be equal to or greater than a predetermined second threshold; and
   configuring a first failure category from the similar wafer groups and another similar wafer group found for the each one of the similar wafer groups in decreasing order of the number of the wafers included in the similar wafer groups.

3. The method as claimed in claim 2, further comprising:
   determining the first failure category to which each of the wafers belong.

4. The method as claimed in claim 2, further comprising:
   identifying at least one of a manufacturing step and a manufacturing device configured to be commonly used to manufacture the wafers belonging to the first failure category from a process history.

5. The method as claimed in claim 2, further comprising:
   setting a second ratio of the number of the wafers belonging to the first failure category and having the first numerical value equal to or greater than the first threshold to the number of the wafers belonging to the first failure category, and setting a zero value when each of the wafers fail to belong to the first failure category, to each of the wafers as representative lot values of lots configured with the wafers;
   calculating a second numerical value configured to represent a degree of similarity between a representative lot values of the lots; and
   detecting another lot having the second numerical value greater than a predetermined third threshold for each of the lots, and forming similar lot sets of the lots having development tendencies of the failures similar to each other.

6. The method as claimed in claim 5, further comprising:
   finding another similar lot set, which allows a third ratio of a number of the lots included in both of said another similar lot set and one of the similar lot sets to a number of the lots included in at least one of said another similar lot set and one of the similar lot sets to be equal to or greater than a predetermined fourth threshold;
   configuring a second failure category from the similar lot sets and the another similar lot set, which is found for the similar lot sets, in decreasing order of the number of the lots included in the similar lot sets; and
   determining a representative lot value that is most characteristic in the second failure category.

7. The method as claimed in claim 6, wherein determining the representative lot value includes:
   finding a first total sum of the second numerical values of the representative lot values of the lots belonging to the second failure category and a second total sum of the second numerical values when a single component is excluded from the representative lot values; and
   finding the component, which allows the difference between the first total sum and the second total sum to be largest.

8. The method as claimed in claim 5, further comprising:
aligning the representative lot values for each of the lots in one of a decreasing and increasing order of the representative lot values, so as to form a reference waveform; and
calculating a residual sum of squares between a waveform, which is formed by aligning representative lot values of other lots in the decreasing or increasing order, and the reference waveform.

9. The method as claimed in claim 5, wherein setting as the representative lot values uses one of average lot values, a wafer failure rate per lot, an intra-lot maximum value, degree of even/odd-caused inhomogeneous distribution, degree of first/latter half-caused inhomogeneous distribution, degree of wafer number-caused inhomogeneous distribution, or a periodic regularity, for the second ratio.

10. The method as claimed in claim 1, wherein calculating the feature amounts includes calculating a failure existing rate as a ratio of a number of the failures developed within each of the sections to a number of all of the failures.

11. The method as claimed in claim 1, wherein calculating the feature amounts includes calculating a first autocorrelation function with an exposure cycle period as a lag for each of the sections.

12. The method as claimed in claim 1, wherein calculating the feature amounts is by expanding the sections and calculating the feature amounts by using the number of the failures developed in the sections.

13. The method as claimed in claim 12, wherein an overlapped area of the expanded sections and the sections adjacent to the expanded sections occupies 60% or less of an area of the sections.

14. The method as claimed in claim 1, further comprising:
generating frequency distributions of the feature amounts for each of the wafers, approximating logarithms of the frequency distributions with quadratic functions, finding second-order coefficients and first-order coefficients of the quadratic functions, and determining whether there are clustering failures based on the second-order coefficients and the first-order coefficients.

15. The method as claimed in claim 1, further comprising:
storing an alignment order for the feature amounts and a lag width;
aligning the feature amounts as waveforms based on the alignment order for each of the wafers; and
calculating second autocorrelation coefficients of the waveforms based on the lag width.

* * * * *